(12) United States Patent
Gupta et al.

(10) Patent No.: US 12,507,382 B2
(45) Date of Patent: *Dec. 23, 2025

(54) RACK-MOUNTABLE HEAT-EXCHANGER FOR MODULAR ELECTRONIC SYSTEMS

(71) Applicant: Cisco Technology, Inc., San Jose, CA (US)

(72) Inventors: Rohit Dev Gupta, Bangalore (IN); Manigandan Boopalan, Bangalore (IN); Arjun G. Jayaprakash, Bengaluru (IN); Parag Ghate, Bengaluru (IN)

(73) Assignee: Cisco Technology, Inc., San Jose, CA (US)

( * ) Notice: Subject to any disclaimer, the term of this patent is extended or adjusted under 35 U.S.C. 154(b) by 180 days.

This patent is subject to a terminal disclaimer.

(21) Appl. No.: 18/448,778

(22) Filed: Aug. 11, 2023

(65) Prior Publication Data

US 2023/0389235 A1   Nov. 30, 2023

Related U.S. Application Data

(63) Continuation of application No. 17/445,470, filed on Aug. 19, 2021, now Pat. No. 11,812,585.

(30) Foreign Application Priority Data

Dec. 22, 2020  (IN) .............................. 202041055805

(51) Int. Cl.
*H05K 7/20* (2006.01)

(52) U.S. Cl.
CPC ..... *H05K 7/20736* (2013.01); *H05K 7/20145* (2013.01); *H05K 7/20836* (2013.01)

(58) Field of Classification Search
CPC ........... H05K 7/20736; H05K 7/20145; H05K 7/20836; H05K 7/207; H05K 7/20754; H05K 7/206
See application file for complete search history.

(56) References Cited

U.S. PATENT DOCUMENTS

| | | | | |
|---|---|---|---|---|
| 8,929,066 | B2 * | 1/2015 | Herman ............... | H05K 7/1487 361/679.5 |
| 2003/0094006 | A1 * | 5/2003 | Des Champs ......... | H05K 7/206 62/186 |
| 2007/0133167 | A1 * | 6/2007 | Wagner .............. | H05K 7/20727 361/679.48 |

(Continued)

*Primary Examiner* — Emmanuel E Duke
(74) *Attorney, Agent, or Firm* — Patterson + Sheridan, LLP

(57) ABSTRACT

A rack-mountable heat-exchanger for modular electronic systems is provided that include a heat exchanger including ambient air inlets and outlets forming an ambient airflow path in a first direction, and recirculating air inlets and outlets forming a recirculating airflow path in a second direction perpendicular to the first direction separated from the ambient airflow path; housing for an electronic device, the housing including internal air inlets and outlets forming an internal airflow path; a first duct configured to link the recirculating air outlet to the internal air inlet; a second duct configured to link the recirculating air inlet to the internal air outlet; and fan assemblies located one of the airflow path, configured to propel air through the heat exchanger in the respective airflow path.

20 Claims, 16 Drawing Sheets

(56) References Cited

U.S. PATENT DOCUMENTS

| | | | | |
|---|---|---|---|---|
| 2008/0037217 | A1* | 2/2008 | Murakami | H05K 7/206 |
| | | | | 361/695 |
| 2009/0262497 | A1* | 10/2009 | Beauchamp | G06F 1/185 |
| | | | | 361/695 |
| 2009/0262501 | A1* | 10/2009 | Claassen | H05K 7/2079 |
| | | | | 29/428 |
| 2012/0087086 | A1* | 4/2012 | Kok | H05K 7/206 |
| | | | | 165/104.34 |
| 2013/0081778 | A1* | 4/2013 | Good | H05K 7/20754 |
| | | | | 165/104.19 |
| 2017/0257976 | A1* | 9/2017 | Chen | H05K 7/206 |
| 2019/0104649 | A1* | 4/2019 | Clidaras | H05K 7/20836 |
| 2019/0200488 | A1* | 6/2019 | Pal | H05K 7/20836 |
| 2020/0296856 | A1* | 9/2020 | Byers | H05K 7/1491 |

* cited by examiner

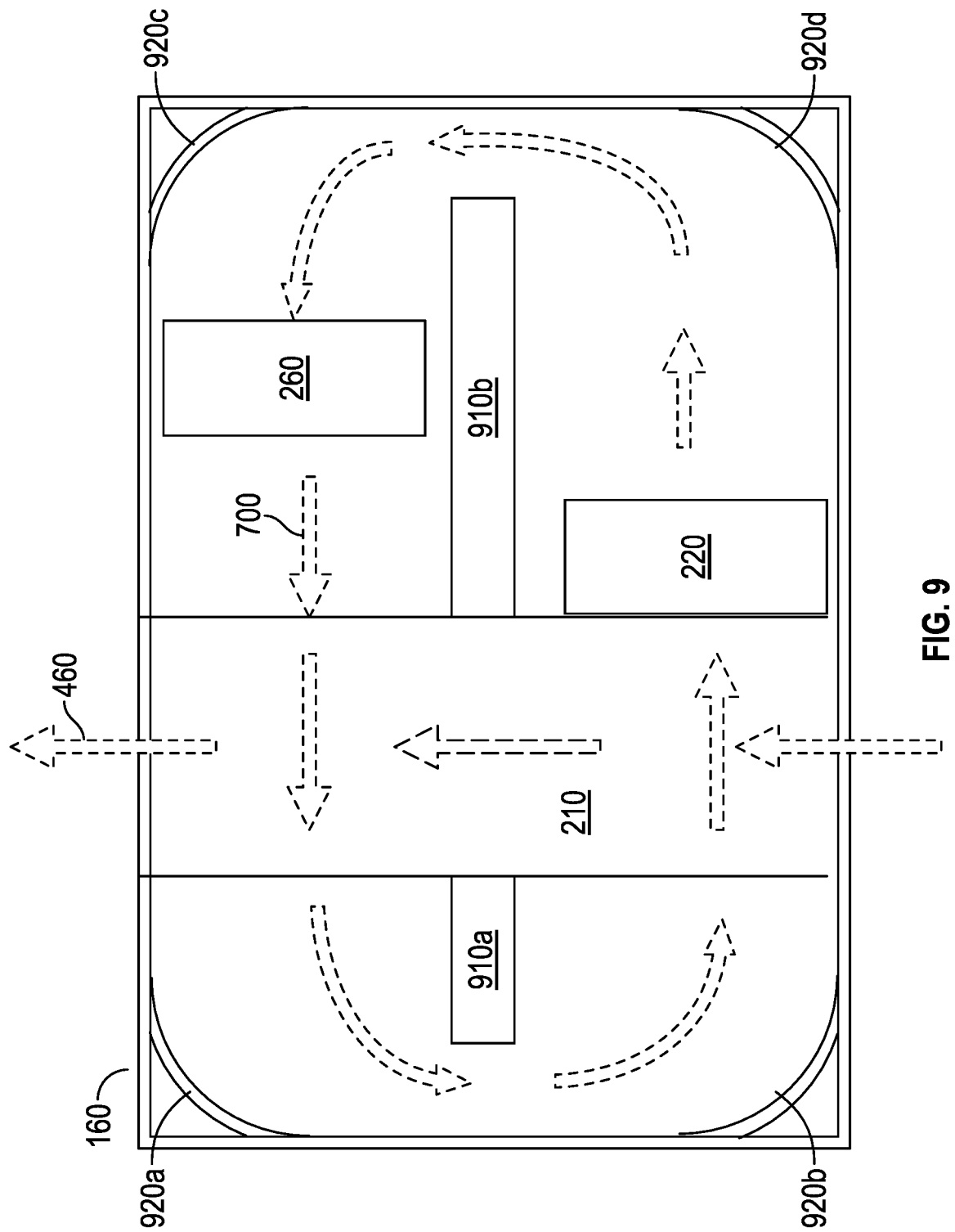

RACK-MOUNTABLE HEAT-EXCHANGER FOR MODULAR ELECTRONIC SYSTEMS

CROSS-REFERENCE TO RELATED APPLICATIONS

This application is a continuation of co-pending U.S. patent application Ser. No. 17/445,470 filed Aug. 19, 2021, which claims benefit of Indian provisional patent application Serial No. 202041055805, filed Dec. 22, 2020. The aforementioned related patent application is herein incorporated by reference in its entirety.

TECHNICAL FIELD

Embodiments presented in this disclosure generally relate to cooling systems for electronic devices. More specifically, embodiments disclosed herein relate to heat exchangers using ambient air as a heat sinking medium in which the recirculating air for cooling the electronic device is isolated from the ambient air.

BACKGROUND

To ensure proper operation, and to prevent damage to various electronic components, various electrical devices sink heat to the environment or other heat sinking medium. As electronic devices can be sensitive to temperature fluctuations and environmental conditions, insufficient cooling can reduce the lifespan of the electrical devices or produce other aberrant effects. Excessive cooling, however, can cause wear and tear on the cooling system, waste energy, complicate the installation and use of the electronic device. Additionally, in some environments, cooling can introduce contaminants to the system being cooled, and induce corrosion of the electrical device.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIG. 9 illustrates a configuration in which the heat exchanger and cooling assembly are divided into flow sections by various baffles, to allow the cooling assembly to provide air circulation in horizontal form factor, according to embodiments of the present disclosure.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
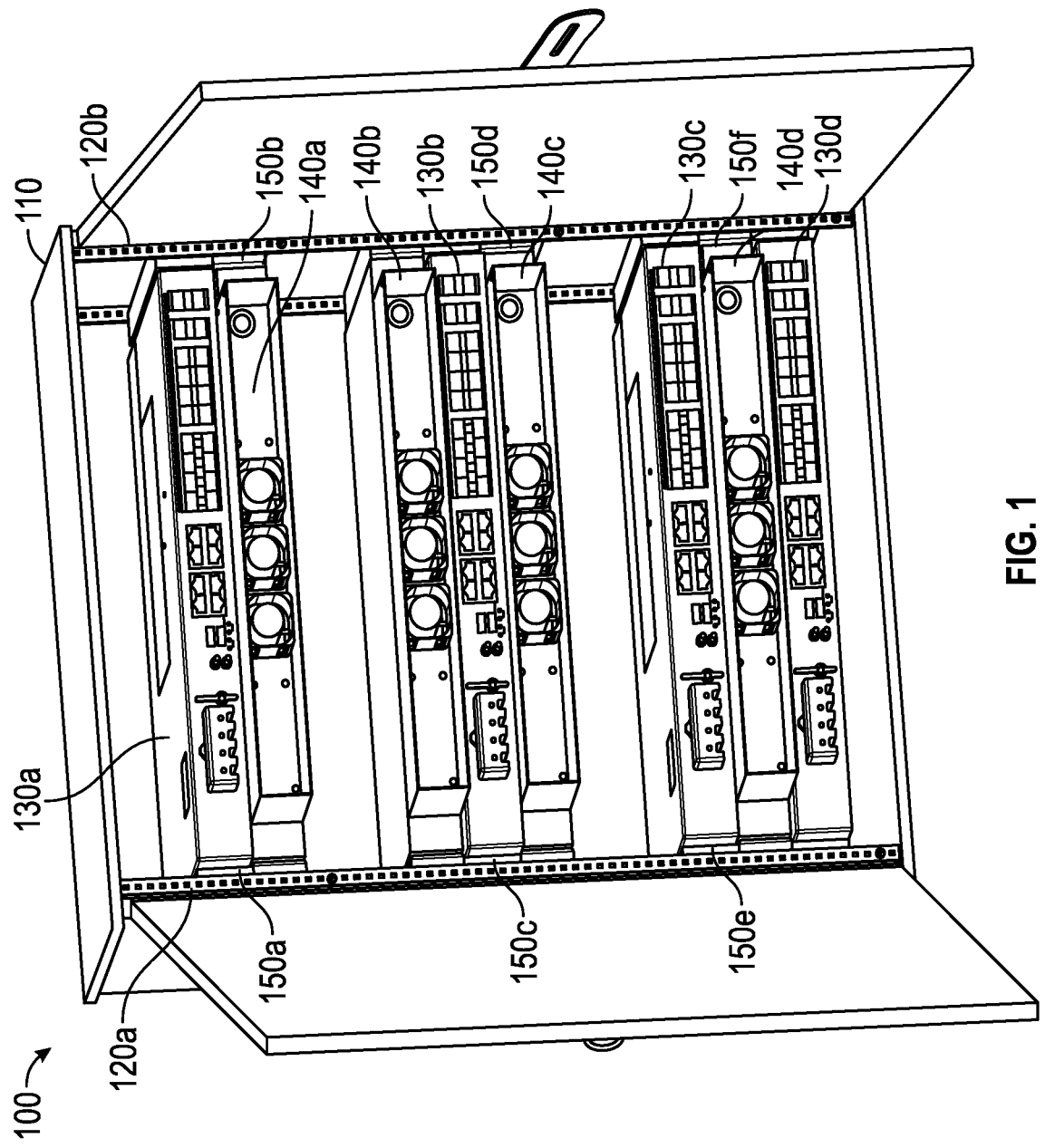
FIG. 1 illustrates a modular rack housing including cooling chassis joined with housing chassis, according to embodiments of the present disclosure.

One embodiment presented in this disclosure is a system, comprising: a heat exchanger including an ambient air inlet and an ambient air outlet forming an ambient airflow path in a first direction, and a recirculating air inlet and a recirculating air outlet forming a recirculating airflow path in a second direction perpendicular to the first direction, wherein the ambient airflow path is separated from the recirculating airflow path; housing for an electronic device, the housing including an internal air inlet and an internal air outlet forming an internal airflow path; a first duct configured to link the recirculating air outlet to the internal air inlet; a second duct configured to link the recirculating air inlet to the internal air outlet; an ambient air fan assembly located in the ambient airflow path, configured to propel ambient air through the heat exchanger in the ambient airflow path; and a recirculating air fan assembly located in the recirculating airflow path, configured to propel air through the heat exchanger in the recirculating airflow path.

One embodiment presented in this disclosure is a system, comprising: a first rack-mountable chassis, comprising: an ambient air inlet and an ambient air outlet defining an ambient airflow path in a first direction; a recirculating air inlet and a recirculating air outlet defining a recirculating airflow path in a second direction perpendicular to the first direction; a heat exchanger disposed in the ambient airflow path and the recirculating airflow path, configured to isolate the ambient airflow path from the recirculating airflow path; and a second rack-mountable chassis, comprising: an internal air inlet and an internal air outlet, defining an internal airflow path in a third direction, wherein the third direction is in a different plane from the second direction; a first duct configured to link the recirculating air outlet to the internal air inlet; and a second duct configured to link the recirculating air inlet to the internal air outlet.

One embodiment presented in this disclosure is a system, comprising: a rack-mountable chassis, comprising: an internal air inlet; an internal air outlet; and an electronic device disposed between the internal air inlet and the internal air outlet; a heatsink, comprising: an ambient air inlet; an ambient air outlet; a recirculating air inlet connected to the internal air outlet; and a recirculating air outlet connected to the internal air inlet; and ducting, configured to isolate recirculating air carried via the recirculating air inlet, the recirculating air outlet, the internal air inlet, and the internal air outlet from air carried via the ambient air inlet and the ambient air outlet.

Example Embodiments

Embodiments of the present disclosure provide a rack-mountable heat-exchanger that offers, among other benefits, superior corrosion protection when using ambient air as a heat sinking medium. Although ambient air can be a convenient medium to transfer heat away from a temperature-regulated system, the presence of humidity, corrosive agents, pollen, dust, particulates, and other contaminants can make ambient air less than ideal for directly cooling those temperature-regulated systems. Therefore, the present disclosure provides a heat exchanger that separates two distinct airflow pathways to keep recirculating air physically separate from the ambient air, but allows heat transfer therebetween. This physical separation of the air in the airflow paths prevents the contaminants from coming in contact with the temperature-regulated systems, and thus prolongs the operational lifetimes of the systems by reducing the risks of corrosion, contamination, rust, or debris collecting in the system.

Various ducting and removable fan assemblies route the recirculating air over a temperature-regulated system (e.g., an electronic device) and the control of the fans can be based on the temperature of the device, the temperature of a chassis recirculating the air, the ambient temperature, ambient humidity (or particulate content), and combinations thereof. Various features of the disclosed rack-mountable heat exchanger are discussed that improve the ease of maintenance, reduce the need for maintenance, and increase the number of environments in which an electronic device that requires cooling for proper operation can be deployed.

FIG. 1 illustrates a deployment 100 of cooling assemblies 160a-c (generally, cooling assembly 160) housed within a modular cabinet 110, according to embodiments of the present disclosure. The individual cooling assemblies 160 include cooling chassis 140a-d (generally or collectively, cooling chassis 140) joined with corresponding housing chassis 130a-d (generally or collectively, housing chassis 130) in various combinations. Each of the cooling assemblies 160 are mounted to rails 120a-b (generally or collectively, rails 120) within the modular cabinet 110 where the rails 120a-b form a rack-mounting system within the modular cabinet 110 for the various rack-mountable chassis and ducting. Although not illustrated, other rails 120 (e.g., in the rear of the modular cabinet 110) can be included to allow for mounting cooling assemblies 160 in the modular cabinet 110. Each cooling assembly 160 also includes various ducts 150a-f (generally or collectively, duct 150 or ducting) that are affixed to opposite sides of cooling assembly 160, allowing recirculation of airflow among the associated cooling chassis 140 and housing chassis 130.

Rails 120 are depicted here according to the "pizza-box" common industry form factor, with slots roughly 19" wide and 1.75" tall, however one of ordinary skill in the art will appreciate that rails 120 may be of any spacing, size, number, or orientation, as a given application demands. Depending on the layout of the rails 120, and the relative sizes and numbers of elements in the cooling assemblies 160, the elements of the cooling assemblies 160 can be secured to the rails 120 by various fasteners or connectors inserted through various through-holes or mounting brackets connected to or integrated in the cooling assembly 160 or rails 120. The mounting hardware needed to secure the cooling assembly 160 to the rails 120 may be omitted from some of the several views shown in the present Figures so as to not obscure other structural or functional features of the elements, but one of ordinary skill in the art will appreciate that such mounting hardware is intended to be included in a fully-assembled and installed cooling assembly 160.

In a first cooling assembly 160a, a first housing chassis 130a is joined with a first cooling chassis 140a, where the first cooling chassis 140a is mounted to the rails 120 in a slot directly below the first housing chassis 130a on the rack-mounting system. In various embodiments, the first cooling chassis 140a may instead be mounted above the associated first housing chassis 130a. The first cooling assembly 160a further includes a first duct 150a and a second duct 150b mounted to opposite sides of the mated first housing chassis 130a and first cooling chassis 140a. As depicted in greater detail in regard to FIG. 7, the ducts 150, first cooling chassis 140a, and first housing chassis 130a create a closed-loop airflow path, which enables cooling of the first housing chassis 130a by the first cooling chassis 140a while keeping ambient air isolated from the closed-loop airflow path.

In a second cooling assembly 160b, a second housing chassis 130b is joined with a second cooling chassis 140b and a third cooling chassis 140c. The second cooling chassis 140b is mounted to the rails 120 in a slot directly above the second housing chassis 130b on the rack-mounting system. Similarly, the third cooling chassis 140c is mounted to the rails 120 in a slot directly below the second housing chassis 130b on the rack-mounting system. The second cooling assembly 160b further includes a third duct 150c and a fourth duct 150d mounted to opposite sides of the mated second housing chassis 130b, second cooling chassis 140b, and third cooling chassis 140c. The third duct 150c, the fourth duct 150d, the second housing chassis 130b, the second cooling chassis 140b, and the third cooling chassis 140c create a closed-loop airflow, which enables cooling of the second housing chassis 130b by both the second cooling chassis 140b and the third cooling chassis 140c while keeping ambient air isolated from the closed-loop airflow path.

In a third cooling assembly 160c, a third housing chassis 130c and a fourth housing chassis 130d are both joined with a fourth cooling chassis 140d. The third housing chassis 130c is mounted to the rails 120 in a slot directly above the fourth cooling chassis 140d on the rack-mounting system. Similarly, the fourth housing chassis 130d is mounted to rails 120 in a slot directly below the fourth cooling chassis 140d on the rack-mounting system. The third cooling assembly 160c further includes a fifth duct 150e and a sixth duct 150f mounted to opposite sides of the mated third housing chassis 130c, fourth housing chassis 130d, and fourth cooling chassis 140d. The fifth duct 150e, the sixth duct 150f, the third housing chassis 130c, the fourth housing chassis 130d, and the fourth cooling chassis 140d, create a closed-loop airflow path, with the third housing chassis 130c, the fourth housing chassis 130d, and the fourth cooling chassis 140d, which enables cooling of both the third housing chassis 130c and fourth housing chassis 130d by the fourth cooling chassis 140d while keeping ambient air isolated from the closed-loop airflow path.

One of ordinary skill in the art will appreciate that the cooling assemblies 160a-c illustrated in FIG. 1 are non-limiting examples of the possible configurations that can be made by joining housing chassis 130 with cooling chassis 140. One of ordinary skill in the art will appreciate that other configurations of cooling chassis 140 joined with housing chassis 130 are contemplated. Accordingly, the ratio of cooling chassis 140 to housing chassis 130 in a given cooling assembly 160, and the relative configuration thereof, can vary according to the cooling requirements and space restrictions of a given application.

Additionally, one of ordinary skill in the art will appreciate that such configurations of cooling chassis 140 joined with housing chassis 130 can be constructed in various environments, inside or outside of various modular cabinets 110, and on or off of various rails 120. Further, one of ordinary skill in the art will appreciate that the number, size, and orientation of the modular cabinet 110, rails 120, housing chassis 130, cooling chassis 140, and ducts 150 can vary according to the demands of a given application.

Figure 2A:
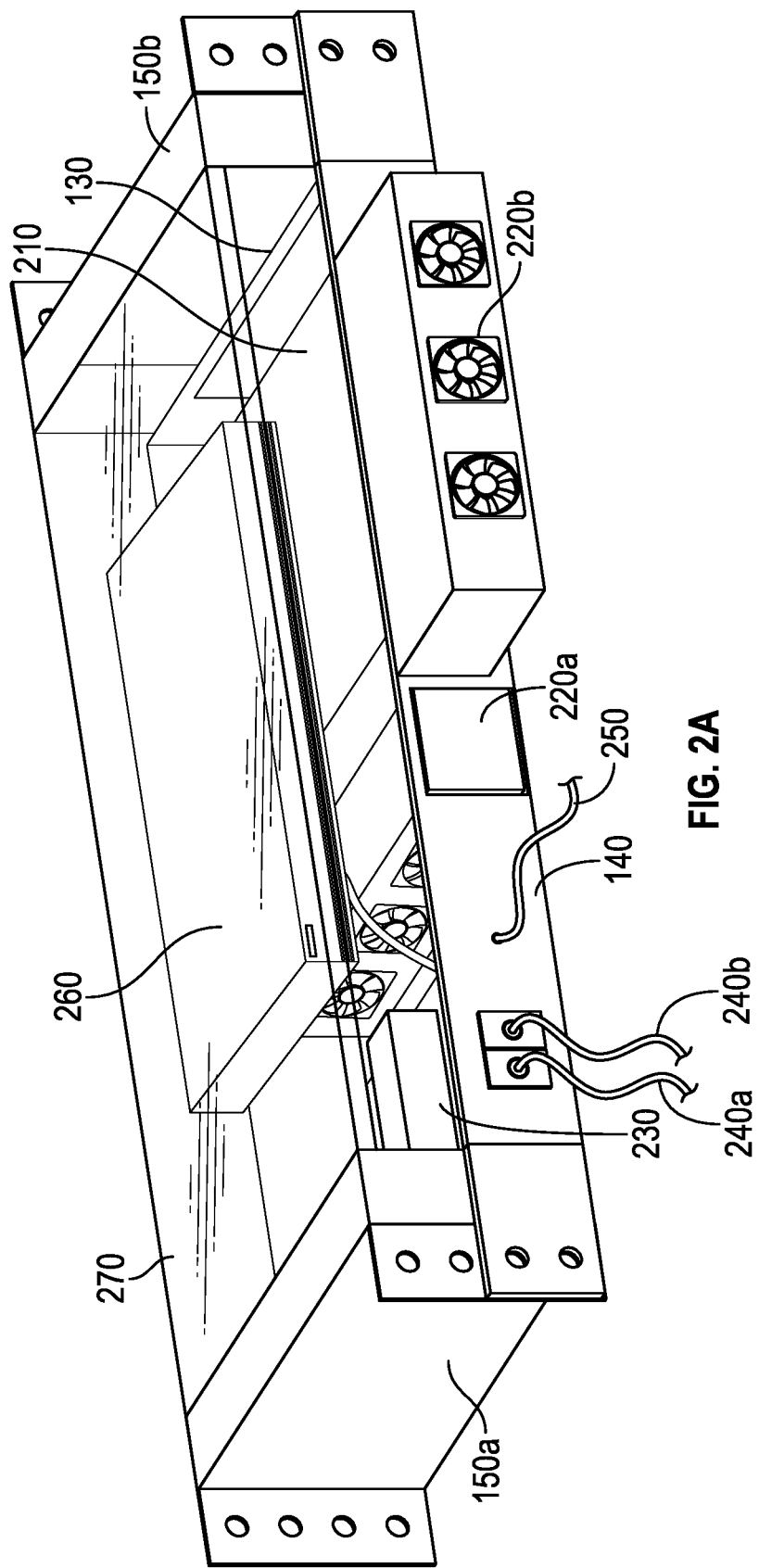
FIGS. 2A-2B illustrate details of a cooling chassis joined with a housing chassis, according to embodiments of the present disclosure.
Figure 2B:
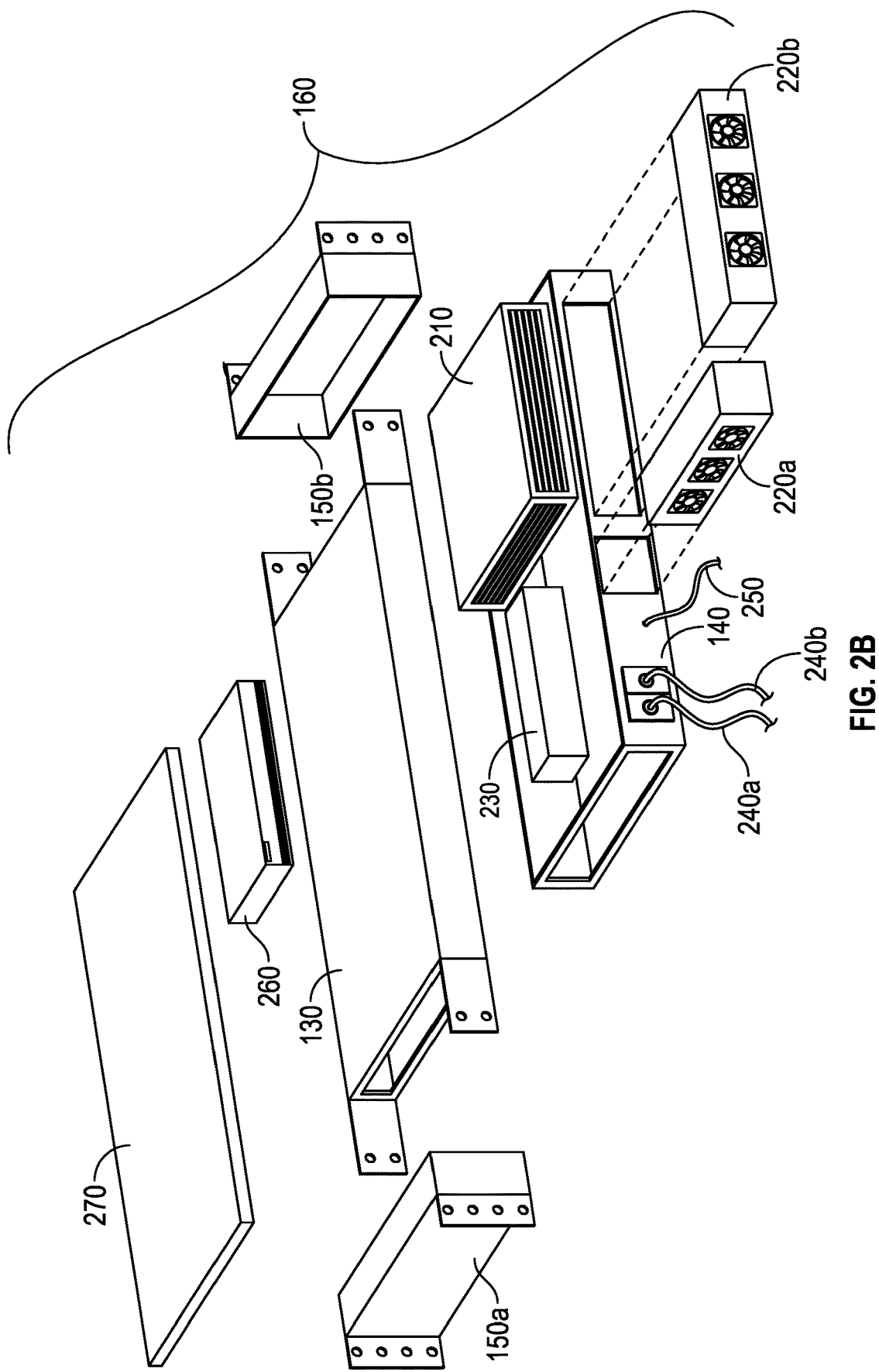

FIGS. 2A-2B illustrate details of a cooling chassis 140 joined with a housing chassis 130, according to embodiments of the present disclosure. FIG. 2A illustrates an assembled view of a cooling assembly 160, while FIG. 2B illustrates an exploded view of the cooling assembly 160. FIG. 2B has been exploded along directions and orientations that the components of cooling assembly 160 can be assembled or selectively removed. The housing chassis 130 houses an electronic device 260, and is placed above the cooling chassis 140. In various embodiments, the electronic device 260 includes a computing device 1300 as discussed in relation to FIG. 13. In other embodiments, electronic device 260 could instead be a passive device, or even omitted entirely. Accordingly, the electronic device 260 can perform different functions, not limited to computing, storage, communication, or networking equipment architecture.

In various embodiments, the cooling chassis 140 houses a fan controller 230, a first removable fan assembly 220a (generally or collectively, removable fan assembly 220) to act as a recirculating air fan assembly, and a heat exchanger 210. A second removable fan assembly 220b is mounted to the outside of the cooling chassis 140 (e.g., to an ambient air inlet or outlet of the heat exchanger 210) in a perpendicular orientation to the first removable fan assembly 220a to act as an ambient air fan assembly. In various embodiments, the first removable fan assembly 220a is selectively removable from the cooling chassis 140 via an opening in an exposed wall or face of the cooling chassis 140.

The fan controller 230 can be in communication with the electronic device 260 or other sensors in the housing chassis 130 or cooling chassis 140 to regulate the airflow in the cooling assembly 160 by controlling the various removable fan assemblies 220. In various embodiments, the fan controller 230 includes a computing device 1300 as discussed in relation to FIG. 13, and can be mounted internally to the cooling assembly 160 or externally. Depending on the relative temperatures inside and outside of the cooling assembly 160, the fan controller 230 provides control of the ambient air fans (e.g., the removable fan assemblies 220 in the ambient airflow path) and the recirculating air fans (e.g., the removable fan assemblies 220 and individual fans in the recirculating airflow path) based on heat dissipation in the electronic device 260, and a target temperature to keep the electronic device 260 cooled to.

In various embodiments, a fan signal line 250 is routed between the fan controller 230 and the electronic device 260, through one or more of a wall of the cooling chassis 140 and a wall of the housing chassis 130. The fan signal line 250 supplies status and control signals from the fan controller 230 to the electronic device 260 and vice versa. Fan power wires 240a-b (generally or collectively, fan power wiring 240) are routed from the fan controller 230, through a wall of the cooling chassis 140, to a power source (not illustrated). A protective cover 270 is optionally affixed in some embodiments to the top of the housing chassis 130. The protective cover 270, when installed, seals any ventilation openings (not depicted) on housing chassis 130 and assists in filling any open voids in a rack-mounting system. In various embodiments, the protective cover 270 assists in the installation of a protective cover 800, discussed in relation to FIG. 8, affixed to the front of the cooling assembly 160, The two protective covers fill or block off all ventilation openings to prevent ambient air from contacting the electronic device 260 and any cable connections.

For example, in the industry standard "pizza-box" layout, the housing chassis 130 can take up one or more rack-mounts worth of space (e.g., 1.75", 3.5", 5.25", etc.), while the cooling chassis 140 takes up less than one rack-mount worth of space (e.g., h", where h<1.75), so a protective cover 270 is sized so that the total cooling assembly 160 takes up an even number of rack-mount spaces (e.g., having an installed height of 1.75-h" inches for the cooling assembly 160 to be x*1.75" tall). In other examples, the cooling chassis 140 take up one or more rack-mounts worth of space, or differently dimensioned rack-mounts may be used. Accordingly, the widths and heights of the housing chassis 130 and cooling chassis 140 may be adapted to the rack-mount dimensions and housing/cooling needs of the contained electronic devices 260, and the size/shape of the protective covers 270 and ducting 150 may be similarly adapeted.

Figure 3:
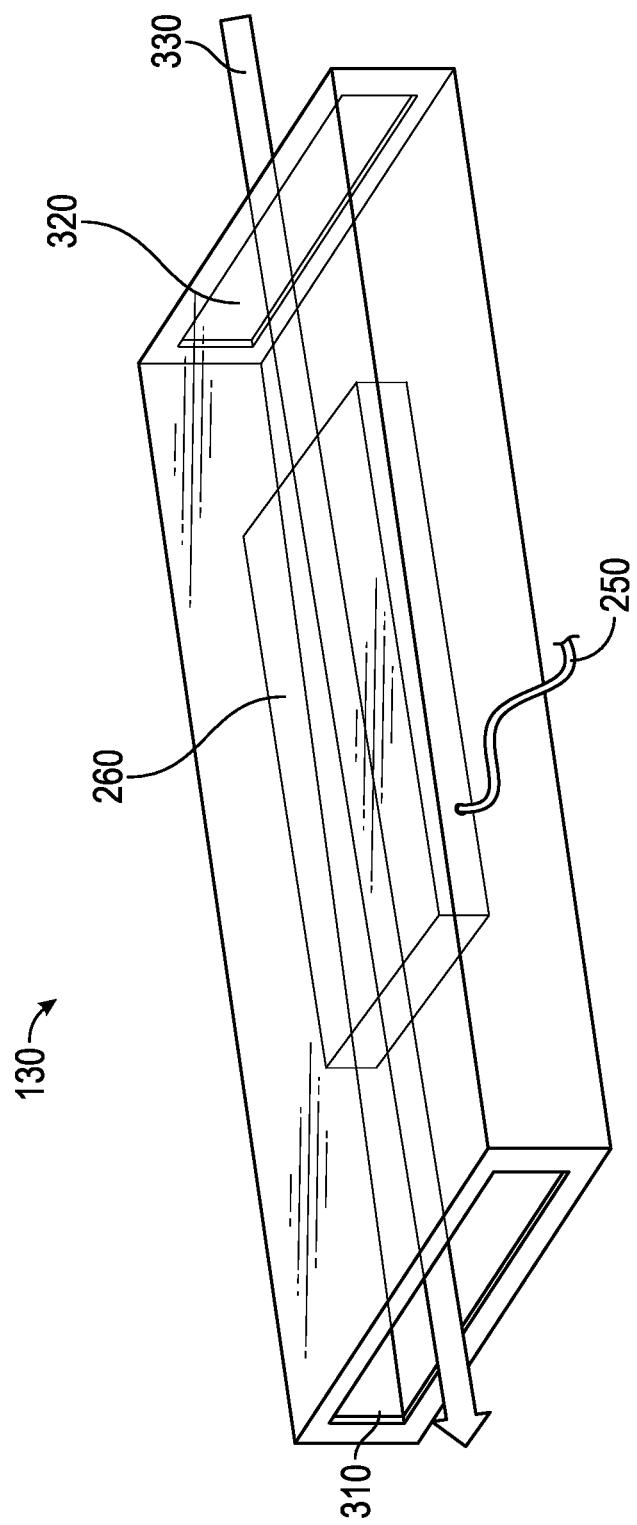
FIG. 3 illustrates a housing chassis, according to embodiments of the present disclosure.
Figure 4:
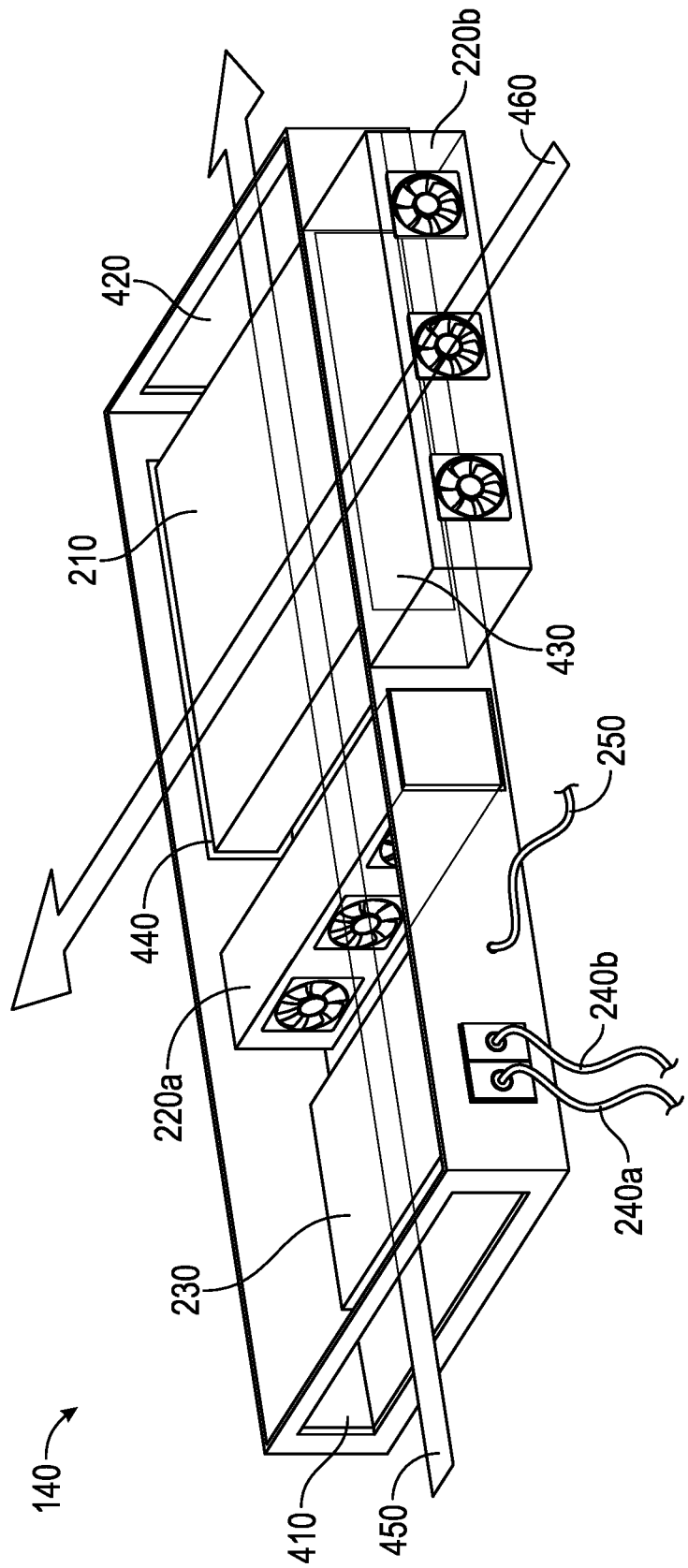
FIG. 4 illustrates a cooling chassis, according to embodiments of the present disclosure.
Figure 5:
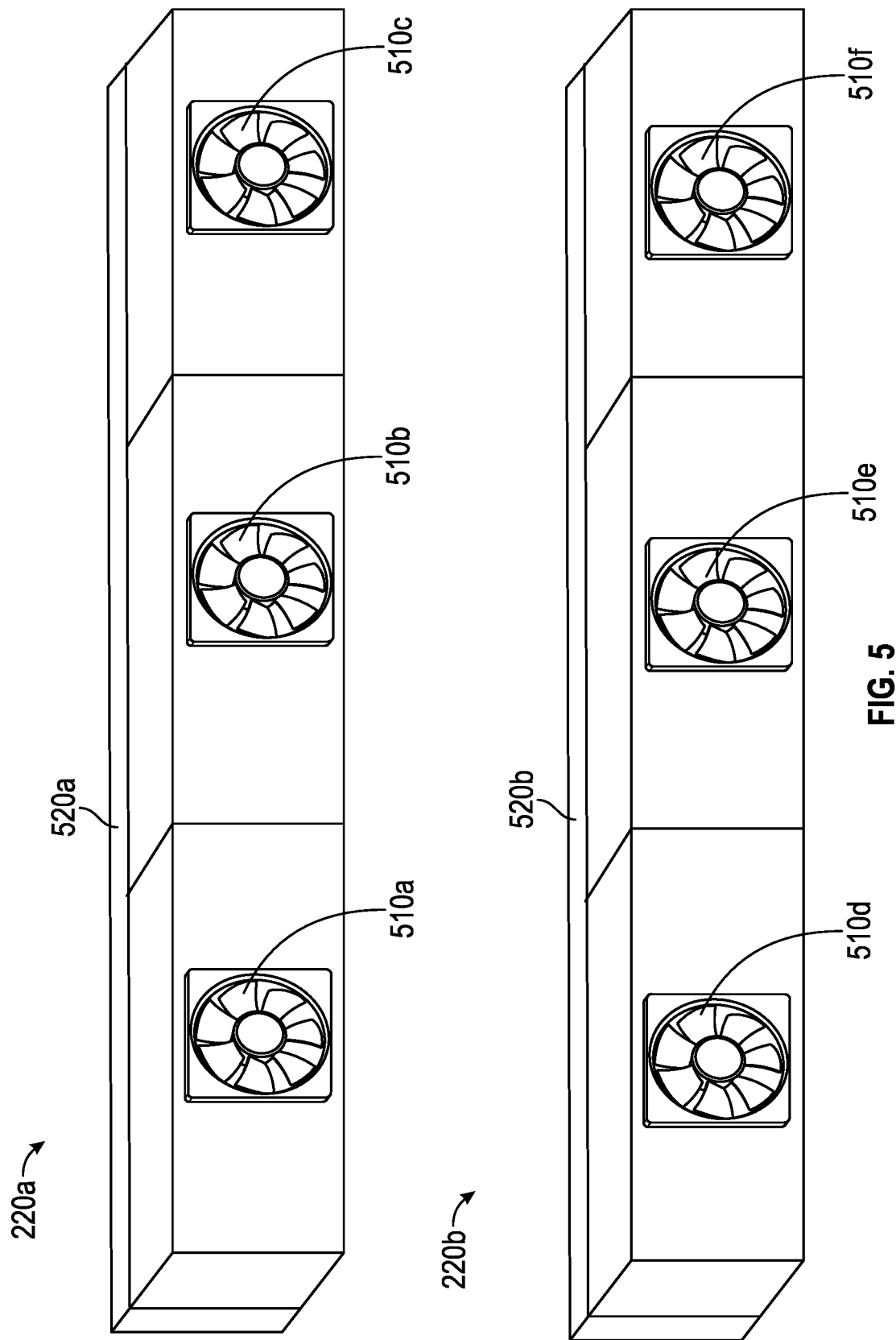
FIG. 5 illustrates a plurality of fan assemblies, according to embodiments of the present disclosure.
Figure 6:
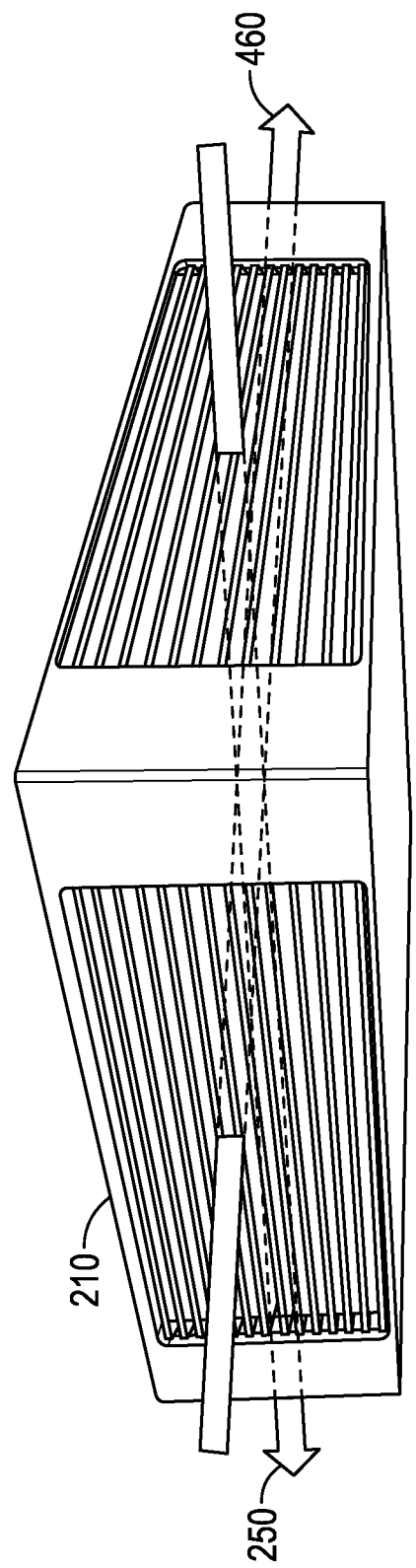
FIG. 6 illustrates a heat exchanger, according to embodiments of the present disclosure.
Figure 12:
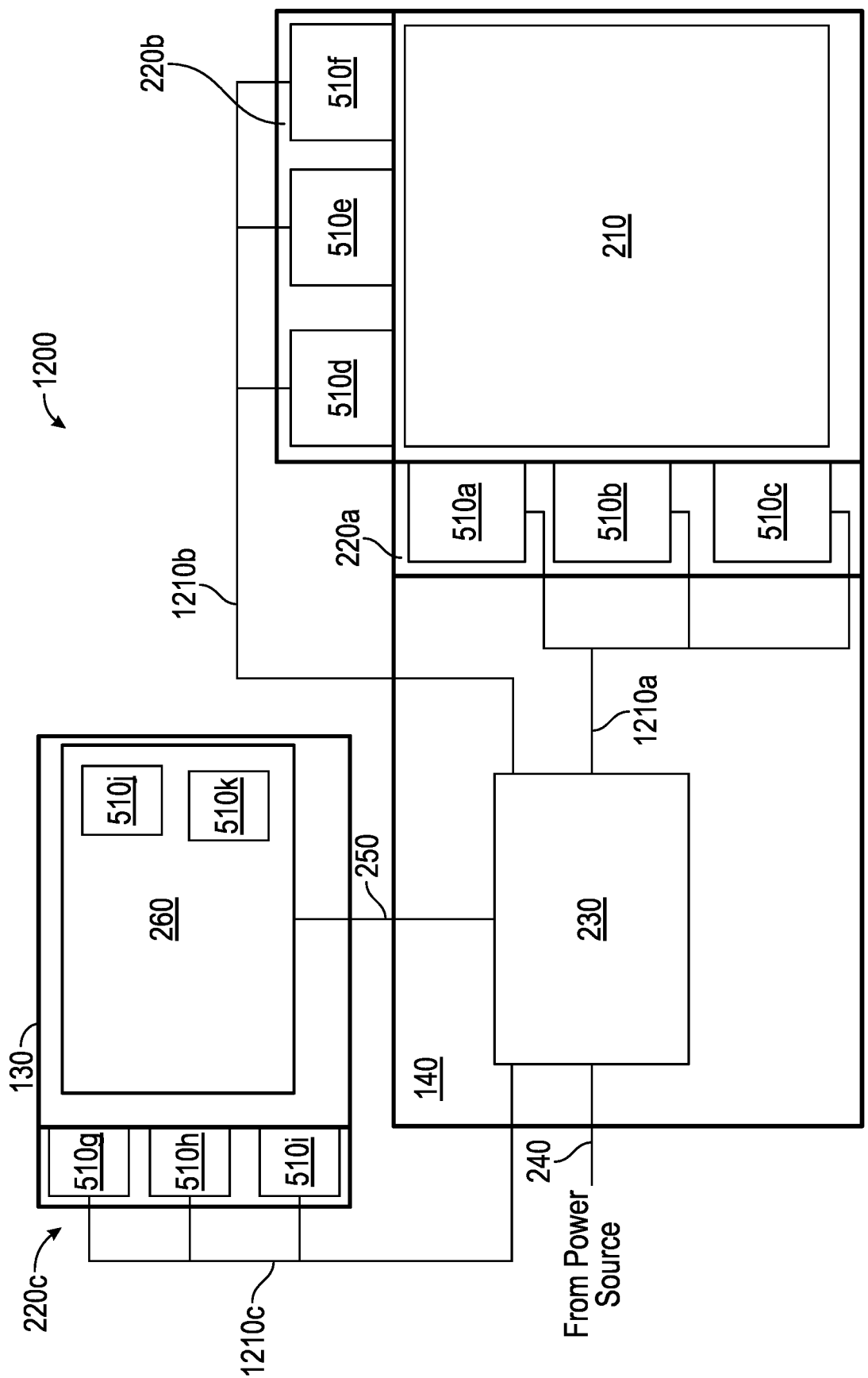
FIG. 12 illustrates a fan controller system, according to embodiments of the present disclosure.

Additional details, including relevant airflow paths, can be seen for a housing chassis 130 in FIG. 3, a cooling chassis 140 in FIG. 4, removable fan assemblies 220a-b in FIG. 5, a heat exchanger 210 in FIG. 6, a cooling assembly 160 in FIG. 7, and a fan controller 230 in FIG. 12.

FIG. 3 illustrates a housing chassis 130, according to embodiments of the present disclosure. The housing chassis 130 contains the electronic device 260, which has the fan signal line 250 routed through one or more of a wall of the housing chassis 130 and out to the cooling chassis 140. The housing chassis 130 further defines an internal air outlet 310 and an internal air inlet 320. In various embodiments, the internal air outlet 310 and internal air inlet 320 are in opposite walls of the housing chassis 130. Although each of the internal air outlet 310 and the internal air inlet 320 are illustrated as a single opening, one or both may instead be manifested as a plurality of openings in any shape or size defined in the housing chassis 130.

The internal air outlet 310 and the internal air inlet 320 define an internal airflow path 330 between one another. The internal airflow path 330 is depicted as allowing air to flow from outside housing chassis 130, in through the internal air inlet 320, over or through the electronic device 260, out through the internal air outlet 310, and back out of the housing chassis 130. In other embodiments, the internal airflow path 330 may instead flow through the constituent features of the housing chassis 130 in a reverse order to the one depicted in FIG. 3 (e.g., swapping the relative locations of the openings designated as the internal air inlet 320 and the internal air outlet 310). As shown in further detail in FIG. 7, when the housing chassis 130 is assembled with the cooling chassis 140 and ducts 150 into a cooling assembly 160, the internal airflow path 330 is isolated from ambient air in the cooling assembly 160.

FIG. 4 illustrates a cooling chassis 140, according to embodiments of the present disclosure. The cooling chassis 140 contains the fan controller 230, the first removable fan assembly 220a, and the heat exchanger 210. The fan signal line 250 is connected to the fan controller 230 and is routed through one or more walls of the cooling chassis 140 and out to housing chassis 130. The fan power wiring 240 is connected to the fan controller 230 and is routed through one or more walls of the cooling chassis 140 and out to a power source (not illustrated). As illustrated, the second removable fan assembly 220b is mounted to the external wall of the cooling chassis 140. In other embodiments, the second removable fan assembly 220b can be mounted inside the cooling chassis 140 or the heat exchanger 210.

The cooling chassis 140 further defines a recirculating air inlet 410, a recirculating air outlet 420, an ambient air inlet 430, and an ambient air outlet 440. In various embodiments, the recirculating air inlet 410 and recirculating air outlet 420 are defined in opposite walls of the cooling chassis 140. In various embodiments, the ambient air inlet 430 and the ambient air outlet 440 are in opposite walls of the cooling chassis 140, perpendicular to the walls defining the recirculating air inlet 410 and recirculating air outlet 420. Although each of the recirculating air inlet 410, the recirculating air outlet 420, ambient air inlet 430, and ambient air outlet 440 are illustrated as a single opening, any number of openings in any shape or size may be defined in the housing chassis 130 to define the respective inlets or outlets.

The recirculating air inlet 410 and the recirculating air outlet 420 define a recirculating airflow path 450 between one another. The recirculating airflow path 450 is depicted as allowing air to flow from outside of the cooling chassis 140, in through the recirculating air inlet 410, over or through the fan controller 230, through the first removable fan assembly 220a, through the heat exchanger 210, out through the recirculating air outlet 420, and back out of the cooling chassis 140. In other embodiments, the recirculating airflow path 450 may instead flow through the constituent features of the housing chassis 130 in a reverse order to the one depicted in FIG. 4 (e.g., swapping the relative locations of the openings designated as the recirculating air inlet 410 and the recirculating air outlet 420). The first removable fan assembly 220a may alternatively be located anywhere along the recirculating airflow path 450, inside or outside of the cooling chassis 140, oriented in such a way that the associated fans propel air along the recirculating airflow path 450. In other embodiments, the recirculating airflow path 450, may bypass constituent elements such as the fan controller 230 altogether. As shown in further detail in FIG. 7, when the housing chassis 130 is assembled with the cooling chassis 140 and ducts 150 into a cooling assembly 160, the recirculating airflow path 450 links with the internal airflow path 330 illustrated in FIG. 3, creating a new closed-loop airflow path that is isolated from ambient air in the cooling assembly 160.

The ambient air inlet 430 and the ambient air outlet 440 define an ambient airflow path 460 between one another. The ambient airflow path 460 is depicted as allowing ambient air to flow from outside cooling chassis 140, through the second removable fan assembly 220b, in through the ambient air inlet 430, through the heat exchanger 210, out through the ambient air outlet 440, and back out of the cooling chassis 140. In other embodiments, the ambient airflow path 460 may alternatively flow through the constituent features of the housing chassis 130 in a reverse order to the one depicted in FIG. 4 (e.g., swapping the relative locations of the openings designated as the ambient air inlet 430 and the ambient air outlet 440). The second removable fan assembly 220b may alternatively be located anywhere along the ambient airflow path 460, inside or outside of the cooling chassis 140, oriented in such a way that the associated fans propel air along the ambient airflow path 460.

The heat exchanger 210 is mounted inside the cooling chassis 140 such that both the recirculating airflow path 450 and the ambient airflow paths 460 pass through the heat exchanger 210, albeit in isolated channels or ducting internal to the heat exchanger 210, which are not shown in FIG. 4, but shown in greater detail in regard to FIG. 6. As discussed in greater detail regarding FIG. 6, the internal structure of the heat exchanger 210 is constructed such that heat transfer is permitted between the air flowing in the recirculating airflow path 450 and ambient airflow path 460 without allowing air from the recirculating airflow path 450 to mix with air from the ambient airflow path 460.

FIG. 5 illustrates a plurality of removable fan assemblies 220, according to embodiments of the present disclosure. Specifically the first removable fan assembly 220a and the second removable fan assembly 220b are illustrated, however one of ordinary skill in the art will appreciate that the illustrated structures may apply to any removable fan assembly 220. Additionally, there may be any number of removable fan assemblies 220 located at various locations within or on the cooling assembly 160 that are located anywhere along the associated airflow path, inside or outside of the associated chassis.

The first removable fan assembly 220a is illustrated as containing three fans 510a-c (generally or collectively, fans 510) and an air filter 520a (generally or collectively, air filters 520) affixed to a side of the fans 510a-c that the fans 510a-c propel air through. Similarly, the second removable fan assembly 220b is illustrated as containing three fans 510d-f and an air filter 520b affixed to a side of the fans 510d-f that the fans 510d-f propel air through. In various embodiments, a given removable fan assembly 220 can contain more or fewer fans 510 than illustrated in FIG. 5, and may optionally include or exclude air filters 520 attached to one or more sides of the fans 510. Additionally, although shown with identical fans 510, in various embodiments, the fan assemblies 220 can include different types of fans 510 in different configurations (numbers, shape, construction etc.).

The removable fan assemblies 220 are provided in locations that allow for in-place replacement of the entire fan assembly 220, individual fans 510, individual air filters 520, and combinations thereof while the electronic device 260 remains installed and powered-on while the individual fan assemblies 220 (or components thereof) are removed from the cooling assembly 160.

In various embodiments each fan 510 and each filter 520 is selectively removable from the removable fan assembly 220. In some embodiments, the fans 510 or filters 520 can be selectively removed by first removing the removable fan assembly 220 from the cooling assembly 160. In various embodiments, the removable fan assemblies 220 can be removed according to the paths on which they were separated from the cooling assembly 160 in FIG. 2B, thus allowing the respective chassis to remain mounted to the rails 120 when removing or replacing fans 510 or filters 520. After the removable fan assembly 220 is removed from the cooling assembly 160, each fan 510 or filter 520 can be removed by disengaging any mechanism attaching the fan 510 or filter 520 to the rest of the removable fan assembly, and disconnecting the associated wiring. Additionally, in some embodiments, the filter 520 can independently be removed without removing fan assembly 220. The air filter 520 can located on either side of the fan assembly 220, and placed upstream in the air flow path, the filter 520 can also prevent contaminated air from passing through to the fan assembly 220. Various designs of air filter 520 can be used to filter air from different contaminations—such as hydrophobic, chemical, etc.

In various embodiments, the associated fans 510 in a given removable fan assembly 220 propel air with the same intensity. In other embodiments, the associated fans 510 in the removable fan assembly 220 may propel air at varying intensities. As shown in further detail in FIG. 12, the fans 510 are controlled and powered by a connected fan controller 230.

FIG. 6 illustrates a heat exchanger 210, according to embodiments of the present disclosure. The internal structure of the heat exchanger 210 comprises a plurality of interleaved channels, wherein the interleaved channels are defined by thermally conductive material (e.g., aluminum, steel, various alloys) to act as a heatsink. These interleaved channels are oriented in a way that airflow in a first direction is physically separated from airflow in a second direction. While the air flowing through the channels is physically separated, the thermally conductive material defining the channels makes physical contact with the air, permitting heat to transfer from air on one side of a channel, to the channel material itself, and then to air on the other side of the channel. The end result is that heat is transferred from air traveling in the first direction to air traveling in the second direction while actual mixing of the air particles in the first direction with the air particles of the second direction does not occur.

In one embodiment, the ambient airflow path 460 flows along the first direction in internal structure of the heat exchanger 210 and the recirculating airflow path 450 flows along the second direction in the internal structure of the heat exchanger 210. This arrangement permits an exchange of heat to take place between the air making up the recirculating airflow path 450 and the ambient airflow path 460, without air in the recirculating airflow path 450 mixing with air in the ambient airflow path.

Heat transfer between the recirculating airflow path 450 and the ambient airflow path 460 regulates the temperature of the air flowing along the closed-loop airflow path (of which recirculating airflow path 450 is a constituent), and thereby regulate the temperature of the electronic device 260. The air flowing along the closed-loop airflow path sinks heat from the electronic device 260 and transfers the heat to the air flowing through the ambient airflow path 460. Depending on the desired temperature of the electronic device 260, and the temperature of the ambient air, the fan controller 230 can adjust the flow rate of air along the associated paths flowing through the heat exchanger 210 by adjusting the speeds of the associated fans 510.

While ambient air can be a convenient medium to transfer heat away from the electronic device 260 or other temperature-regulated system, the presence of humidity, corrosive agents, pollen, dust, particulates, and other contaminants can make ambient air less than ideal for directly cooling those temperature-regulated systems. As described herein, the air in the ambient airflow path 460 does not mix with the air in the recirculating airflow path 450. This physical separation of the air in the airflow paths prevents the contaminants from coming in contact with the temperature-regulated systems, and thus prolongs the operational lifetimes of the systems by reducing the risks of corrosion, contamination, rust, or debris collecting in the system.

Although illustrated with a first plurality of channels through which the air in the recirculating airflow path 450 may be propelled, and a second plurality of channels through with the isolated air in the ambient airflow path may be propelled, in some embodiments, the heat exchanger 210 may include one or a plurality of channels for the ambient airflow path 460, and omit channels for the recirculating airflow path 450; instead allowing the recirculating airflow path 450 to be propelled around the heat exchanger 210 to transfer heat through the external surfaces of the heat exchanger 210 rather than via internal ducting or channels.

Figure 7A:
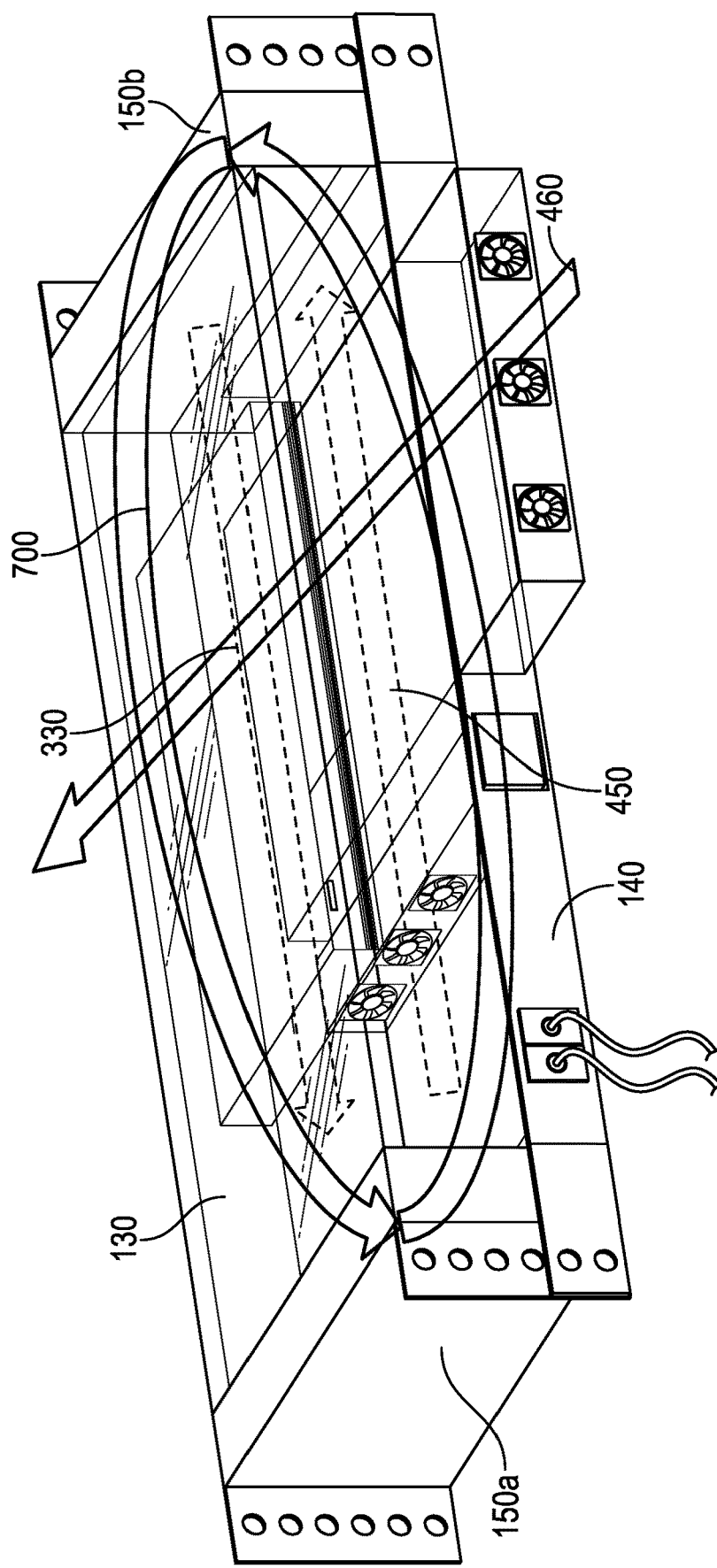
FIG. 7A-7C illustrate closed-loop airflow paths created by joining cooling chassis with housing chassis in various arrangements, according to embodiments of the present disclosure.
Figure 7B:
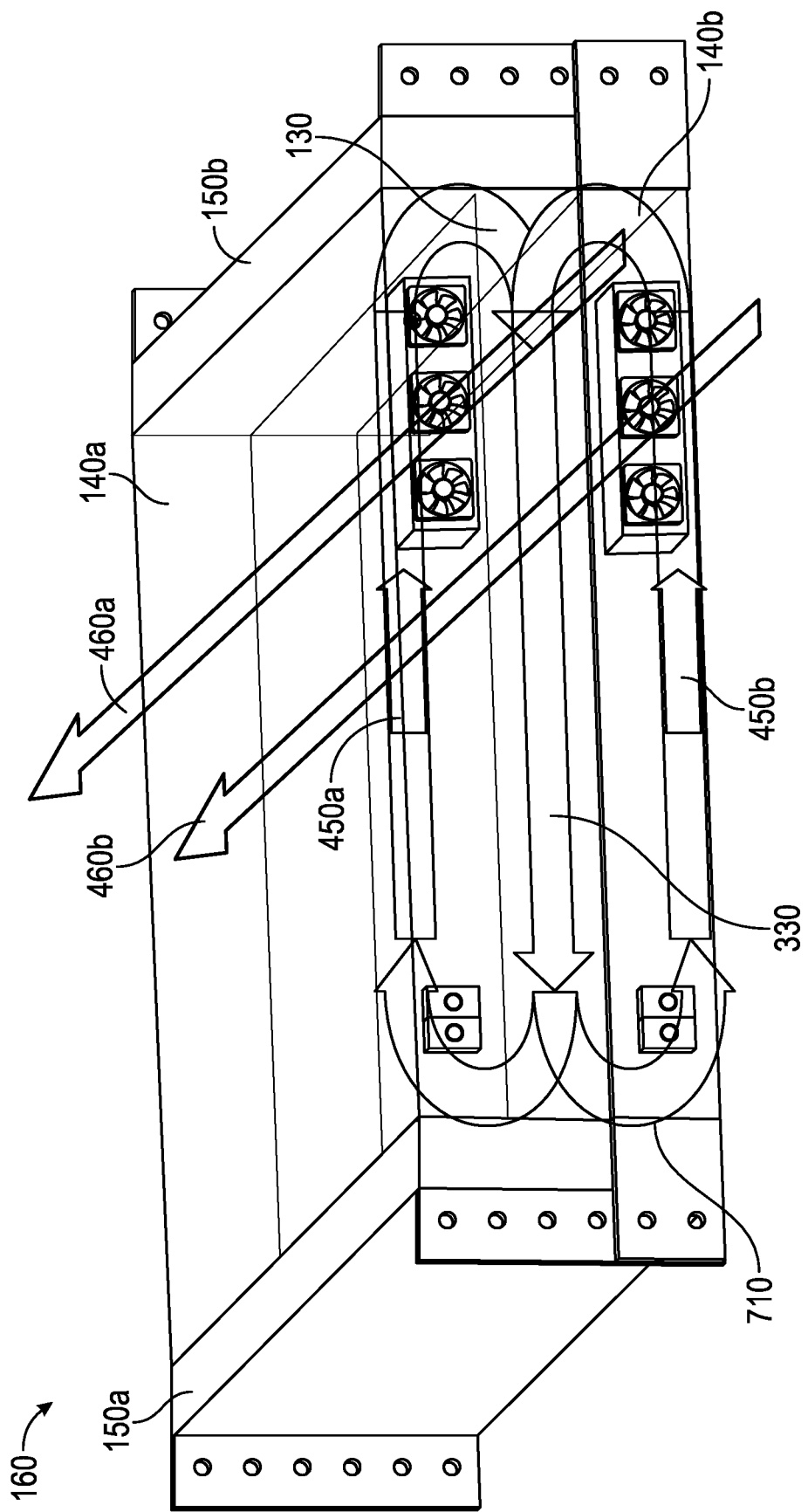
Figure 7C:
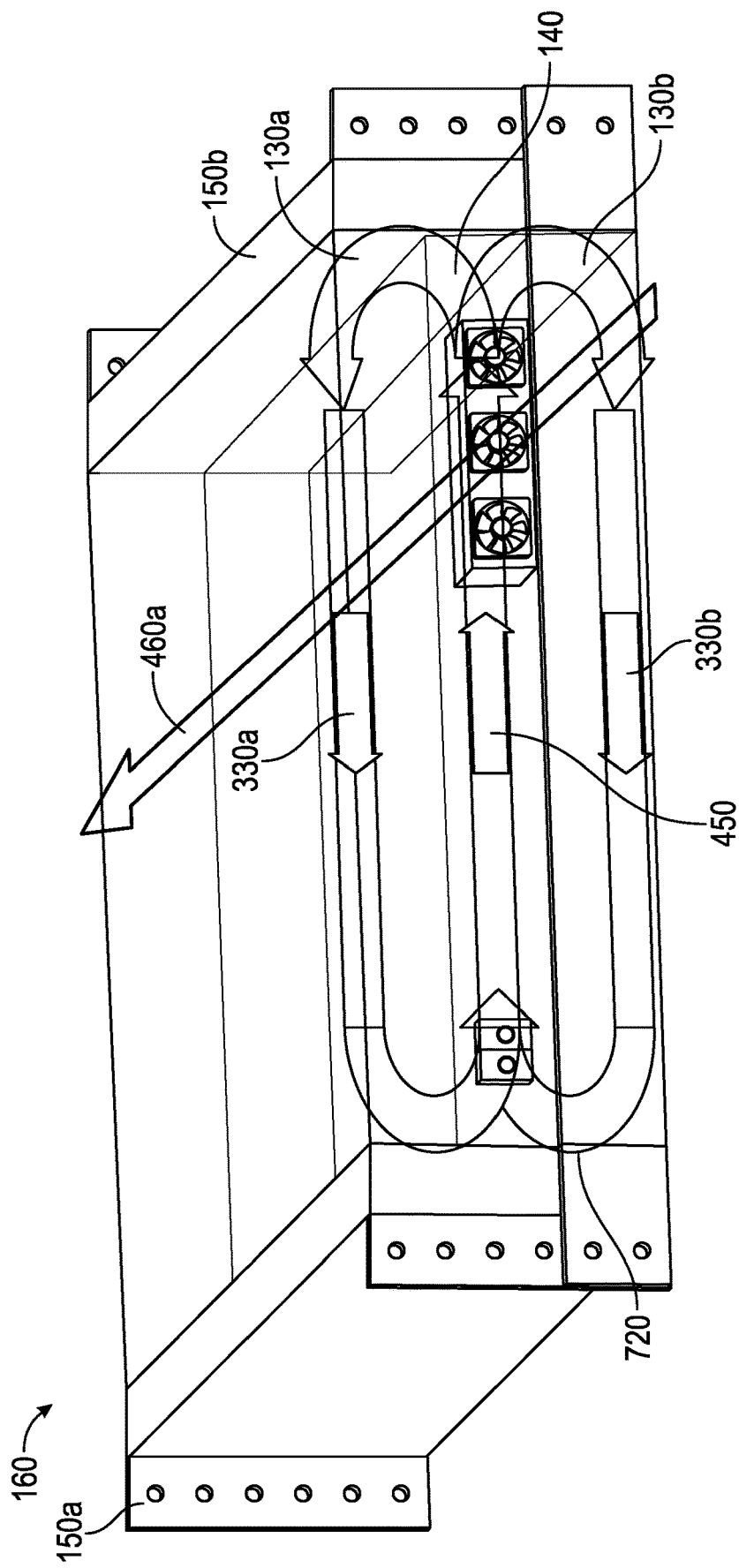

FIGS. 7A-7C illustrate the closed-loop airflow paths within the cooling assemblies 160*a-c*, according to embodiments of the present disclosure.

FIG. 7A illustrates a closed-loop airflow path 700 created by joining a cooling chassis 140 with a housing chassis 130 to form a cooling assembly 160, such as in the first cooling assembly 160*a* shown in FIG. 1. When ducts 150*a-b* are mounted to opposite sides of the mated housing chassis 130 and cooling chassis 140, a recirculating airflow path 450 links with an internal airflow path 330, creating a new, closed-loop airflow path 700 that is isolated from ambient air passing through the cooling assembly 160. Air flowing in the closed-loop airflow path 700 flows along the internal airflow path 330 and the recirculating airflow path 450, which flow through an associated heat exchanger 210. The heat exchanger 210 in turn enables the transfer of heat between air flowing along the closed-loop airflow path 700 and ambient air, without permitting contaminants from the ambient air to mix into air in the closed-loop airflow path 700. The air carried in the closed-loop airflow path 700 flows through and around various electronic components housed within the cooling assembly 160, thus allowing heat to be transferred from the electronic components to the ambient air (or vice versa) without permitting contaminants to be transferred from the ambient air to the components.

The rate of heat transfer between the electronic components and the ambient air depends, in part, on the flow rate of air along the associated paths flowing through the associated heat exchanger 210, which can be controlled by the associated fans 510 propelling air along the associated paths. The direction and intensity of the closed-loop airflow path 700 may be altered as desired by changing the direction and intensity that the associated fans 510 propel air along the closed-loop airflow path 700. The fans 510 are controlled by the fan control system further detailed in FIG. 12.

FIG. 7B illustrates a closed-loop airflow path 710 created by joining two cooling chassis 140*a-b* above and below a single housing chassis 130 to form a cooling assembly 160, such as the second cooling assembly 160*b* shown in FIG. 1. When ducts 150*a-b* are mounted to opposite sides of the mated housing chassis 130 and cooling chassis 140*a-b*, a first recirculating airflow path 450*a* and a second recirculating airflow path 450*b* combine with the internal airflow path 330 to create the closed-loop airflow path 710.

Similarly to the closed-loop airflow path 700 discussed in relation to FIG. 7A, the closed-loop airflow path 710 shown in FIG. 7B is isolated from ambient air in the cooling assembly 160, and the closed-loop airflow path 710 contains air which flows through and around various components of the cooling assembly 160. The cooling assembly 160 contains two cooling chassis 140*a-b* and one housing chassis 130, although any number of cooling chassis 140 can be connected to one housing chassis 130 in other embodiments. In various embodiments, multiple cooling chassis 140 contain analogous components to one another. The signal lines 250a-b of the multiple cooling chassis 140 lead to the same housing chassis 130 and the same associated electronic device 260 within the housing chassis 130, and the associated signal lines 250 can be routed to associated fan controllers 230 for each cooling chassis 140, or to one fan controller 230 for the cooling assembly 160 (e.g., omitting or disabling fan controllers 230 from all but one cooling chassis 140). Accordingly, when using a single fan controller 230 as a centralized or main controller for multiple cooling chassis 140, the signal lines 250 for the removable fan assemblies 220 may be routed to a fan controller 230 housed in a different cooling chassis 140.

Because the cooling assembly 160 contains multiple cooling chassis 140a-b and one housing chassis 130, the cooling assembly 160 can more readily transfer heat away from components in the housing chassis 130, than could be transferred away from the components in the housing chassis 130 of a cooling assembly 160 having one cooling chassis 140. Each of the multiple cooling chassis 140 contain separate associated heat exchangers 210 (as depicted in FIG. 4) to cool air carried in the associated recirculating airflow paths 450. As the recirculating airflow paths 450 combine to supply airflow to the internal airflow path 330 flowing through housing chassis 130, the flow rates additively compound. In some embodiments, the possible airflow rate through the internal airflow path 330 of a cooling assembly 160 using two cooling chassis 140 is effectively doubled versus a cooling assembly 160 that uses one cooling chassis 140. This higher flow rate through the internal airflow path 330 results in superior heat-transfer characteristics between the air in the internal airflow path 330 and the components housed within the housing chassis 130, as the air heated by the components is carried away and replaced with cooled air at a faster rate.

FIG. 7C illustrates a closed-loop airflow path 720 created by joining two housing chassis 130a-b above and below a single cooling chassis 140 to form a cooling assembly 160, such as the third cooling assembly 160c shown in FIG. 1. When ducts 150a-b are mounted to opposite sides of the mated cooling chassis 140 and housing chassis 130a-b, a recirculating airflow path 450 links with both a first internal airflow path 330a in the first housing chassis 130a and a second internal airflow path 330b in the second housing chassis 130b to create the closed-loop airflow path 720.

Similarly to the closed-loop airflow path 700 discussed in relation to FIG. 7A, the closed-loop airflow path 720 is isolated from ambient air in the cooling assembly 160, and the closed-loop airflow path 720 contains air which flows through and around various components of cooling assembly 160. The cooling assembly 160 includes multiple housing chassis 130, which may contain analogous or different components. The signal lines 250a-b of the two housing chassis 130a-b lead to the same cooling chassis 140 and the same associated fan controller 230 (as depicted in FIG. 4) within the cooling chassis 140. A first signal line 250a leads to the associated electronic device 260 of the first housing chassis 130a, and a second signal line 250b leads to the associated electronic device 260 of the second housing chassis 130b. In various embodiments, the fan controller 230 and the two electronic devices 260 have separate fan signal lines 250a-b to transfer control signals and operational readings (discussed in further detail regarding FIG. 12). In other embodiments, the fan controller 230 and the two electronic devices 260 share one fan control line to transfer control signals and operational readings.

In the cooling assembly 160 shown in FIG. 7C, the housing chassis 130a-b both contain associated electronic devices 260 located in the associated internal airflow paths 330a-b. The recirculating airflow path 450 splits to supply air flow to both internal airflow paths 330a-b. In some embodiments, the possible airflow rate through the individual internal airflow path 330a-b is effectively reduced versus cooling assemblies 160 with fewer housing chassis 130 unless addressed with higher fan speeds. As shown by the cooling assembly 160 in FIG. 7C, by containing multiple housing chassis 130a-b and one cooling chassis 140, the cooling assembly 160 can provide heat transfer to the components in multiple housing chassis 130 while only needing the space in the rack-mounting system to accommodate one cooling chassis 140.

Figure 8:
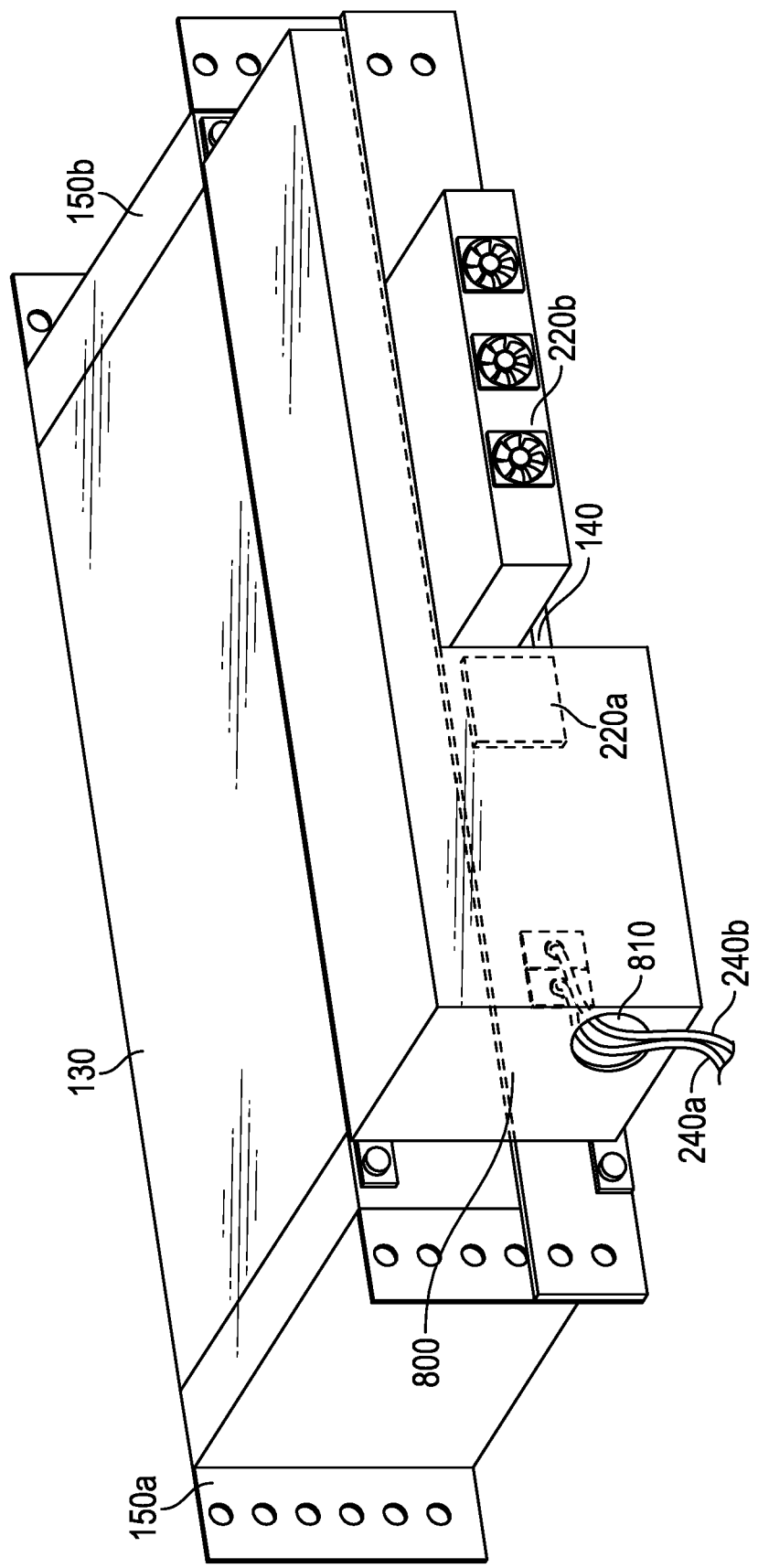
FIG. 8 illustrates a configuration in which a protective covering is applied over a joined cooling chassis and housing chassis, according to embodiments of the present disclosure.

FIG. 8 illustrates a configuration in which a protective covering 800 is applied over a cooling chassis 140 joined with a housing chassis 130, according to embodiments of the present disclosure. The protective covering 800, may be affixed to any side of the cooling assembly 160 not defining an inlet or outlet for one of the constituent airflow paths. The protective covering 800 assists in further sealing the closed-loop (i.e., the combined internal and recirculating) airflow path (shown in greater detail in FIGS. 7A-7C) from ambient air by containing air leaked from the housing chassis 130 or cooling chassis 140 by various avenues (e.g., ports, wire conduits, ventilation grating). Air is prevented from further leaking out of the protective covering 800 by sealing any unavoidable wire conduits (e.g. those that must permit fan power wires 240 to eventually connect with a power source) with a gland 810 or gasket.

FIG. 9 illustrates a configuration for a cooling assembly 160 in which the heat exchanger 210 and cooling assembly 160 are divided into flow sections by various baffles to allow the cooling assembly 160 to provide air circulation in different form factors, according to embodiments of the present disclosure. FIG. 9 may show a top-down view of the closed-loop airflow path 700, where the ambient airflow path 460 flows from front-to-back (or back-to-front), or a side-view of the closed-loop airflow path 700, where the ambient airflow path 460 flows from bottom-to-top (or top-to-bottom). Depending on the configuration and cooling needs of the electronic device 260, the configuration shown in FIG. 9 may occupy one rack unit of space (e.g., 1.75" in height) or multiple rack units in the modular cabinet 110.

In various embodiments, the heat exchanger 210 includes one or more internal baffles (not shown) that divide the air passageways used for the closed-loop airflow path 700 into at least two channels. These (at least) two channels allow the heat exchanger 210 to carry air in the closed-loop airflow path 700 in two different directions (e.g., leftward in the top of FIG. 9 and rightward in the bottom of FIG. 9), thus allowing the internal air to circulate. One or more fan assemblies 220 may be included in the closed-loop airflow path 700 to propel air counterclockwise (or clockwise) through the cooling assembly 160 from one of the channels in the heat exchanger 210 to the other channel, and back again.

A first free-flow baffle 910a (generally or collectively, free-flow baffle 910) and a second free-flow baffle 910b are disposed in the cooling assembly 160 to maintain a circulating (e.g., clockwise or counterclockwise) flow of air in the closed-loop airflow path 700, and separate the divided from one another outside of the heat exchanger 210. Although illustrated with a first free-flow baffle 910a on one side of the heat exchanger 210 and a second free-flow baffle 910b on the opposite side of the heat exchanger 210, in various embodiments, free-flow baffles 910 may be included on only one side of the heat exchanger 210.

Additionally, several corner baffles 920*a-d* (generally or collectively, corner baffle 920) are shown in FIG. 9 in the corners of the cooling assembly 160 to direct the closed-loop airflow path 700 in a circulating path. The various baffles may be configured with different lengths and areas depending on the dimensions of the cooling assembly 160 and relative locations of the heat exchanger 210, fan assemblies 220, and the electronic device 260 to be cooled.

Figure 10A:
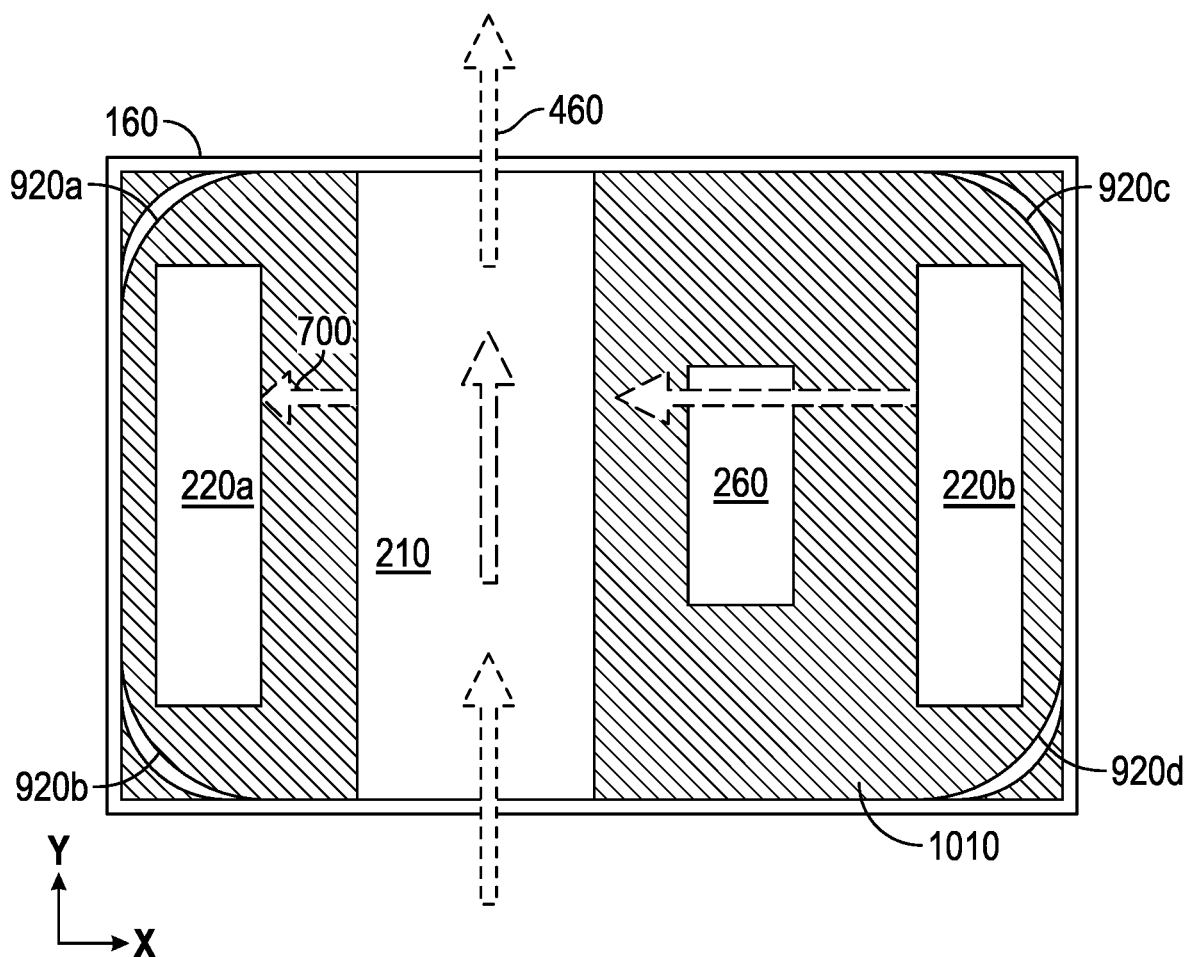
FIGS. 10A and 10B illustrate a configuration in which the housing chassis and cooling chassis are combined, to allow the cooling assembly to provide air circulation in a shorter form factor, according to embodiments of the present disclosure.
Figure 10B:
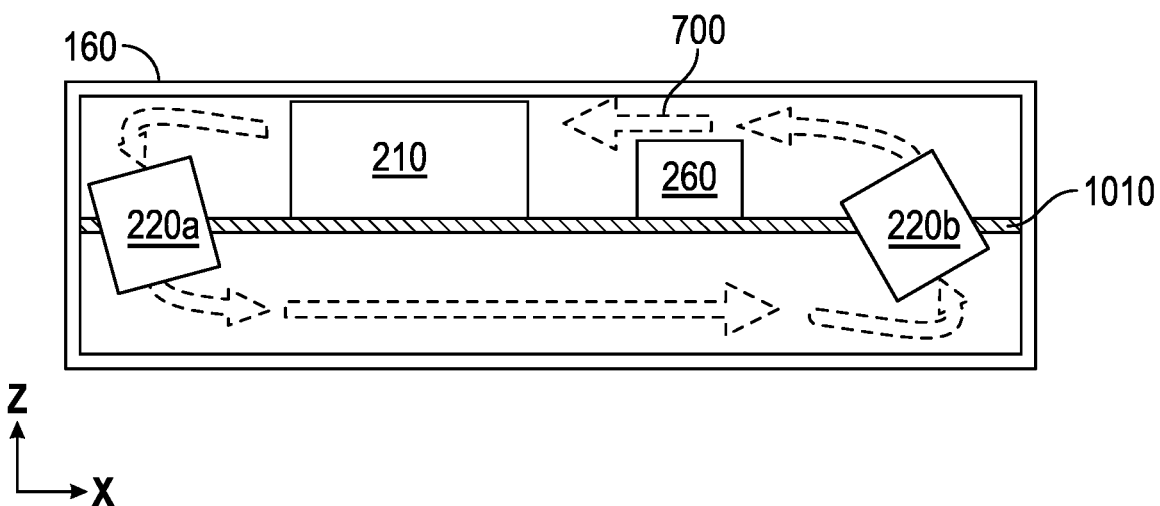

FIGS. 10A and 10B illustrate a configuration for a cooling assembly 160 in which the housing chassis 130 and cooling chassis 140 are combined, according to embodiments of the present disclosure. In various embodiments, the combined chassis allows the cooling assembly 160 to provide air circulation in a shorter form factor than using separate chassis (e.g., one rack unit high versus two rack units high in the Z direction), or in a unit that may installed as a single piece.

A planar baffle 1010 is disposed lengthwise in the cooling assembly 160 to define an upper plane and a lower plane in the cooling assembly 160. As illustrated, the planar baffle 1010 is disposed in an XY plane, and divides the internal space of the cooling assembly into an upper section and lower section (in the Z direction). A first fan assembly 220*a* and a second fan assembly are located on opposite sides of the planar baffle 1010 and opposite sides of the heat exchanger 210, and propel air along the close-loop airflow path 700 between the upper section and the lower section. Optional corner baffles 920*a-d* may be disposed on one or both sides of the planar baffle 1010 to further direct airflow.

Although FIGS. 10A and 10B show both the electronic device 260 and the heat exchanger 210 located in the upper section, in various embodiments, the electronic device 260 and the heat exchanger 210 can be located in opposite sections, or both located in the lower section. Additionally or alternatively, in various embodiments, the planar baffle is an integrated circuit board, which can include the electronic device 260 and the various other electronic or computing devices disposed in the cooling assembly 160.

Additionally, although not illustrated in the configurations shown in FIGS. 10A and 10B, various fan assemblies 220 may be installed at the intakes or outtakes of the heat exchanger 210 to propel air along the respective airflow paths.

Figure 11:
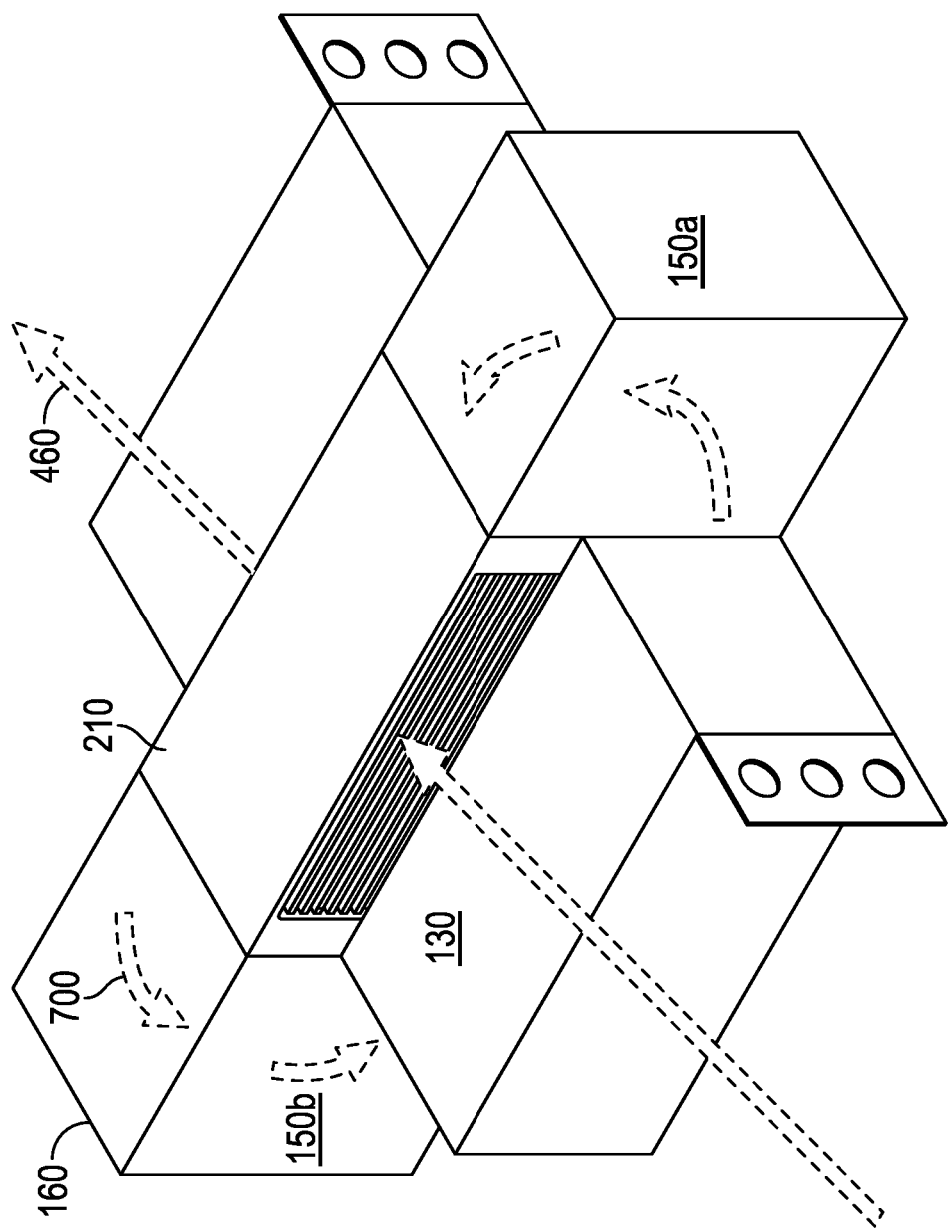
FIG. 11 illustrates a configuration in which the heat exchanger is oriented to provide side-to-side ambient airflow, according to embodiments of the present disclosure.

FIG. 11 illustrates a configuration in which the heat exchanger 210 is oriented to provide side-to-side ambient airflow, according to embodiments of the present disclosure. In various embodiments, the heat exchanger 210 provides ambient airflow paths 460 in a left-to-right or right-to-left orientation, while the closed-loop airflow path 700 is provided in a front-to-back or back-to-front orientation. The ducts 150*a-b*, rather than being installed on the left/right sides of the cooling assembly 160 are installed on the front (e.g., the first duct 150*a*) and on the back (e.g., the second duct 150*b*) of the cooling assembly 160.

In various embodiments, the heat exchanger 210 may be included in a cooling assembly 160 that is also oriented for side-to-side ambient air flow in the same direction as the heat exchanger 210, or ducted for front-to-back ambient airflow in a direction perpendicular to the heat exchanger 210. Additionally, although not illustrated in the configuration shown in FIG. 11, various fan assemblies 220 may be installed at the intakes or outtakes of the heat exchanger 210 to propel air along the respective airflow paths.

FIG. 12 illustrates a fan control system 1200, according to embodiments of the present disclosure. The fan controller system 1200 comprises the fan controller 230, a first removable fan assembly 220*a* (and the constituent fans 510*a-c* thereof), a second removable fan assembly 220*b* (and the constituent fans 510*d-f* thereof), a third removable fan assembly 220*c* (and the constituent fans 510*g-i* thereof), and the electronic device 260 (and the constituent fans 510*j-k* thereof).

In the illustrated embodiment, the electronic device 260 is housed within the housing chassis 130, and the fan controller 230 and the heat exchanger 210 are housed within the cooling chassis 140. In other embodiments, the electronic device 260, fan controller 230, and heat exchanger 210, may be mounted in various locations, including the housing chassis 130, the cooling chassis 140, a chassis not depicted, or externally to any chassis.

In some embodiments, the first removable fan assembly 220*a* is mounted inside of cooling chassis 140 at various other locations along the recirculating airflow path 450. These locations may include externally to the side of cooling chassis 140 and over an recirculating air inlet 410, within the cooling chassis 140 and between the recirculating air inlet 410 and the fan controller 230, within the cooling chassis 140 and between the heat exchanger 210 and the recirculating air outlet 420, externally to the side of the cooling chassis 140 and over the recirculating air outlet 420, within one of the ducts 150, etc. In various embodiments additional removable fan assemblies 220 may mounted at any of the various locations along the recirculating airflow path 450 to affect the airflow rate along the recirculating airflow path 450.

In some embodiments, the second removable fan assembly 220*b* is externally mounted to the side of cooling chassis 140, over an ambient air outlet 440, allowing the fans 510*d-f* to propel air along the ambient airflow path 460. In other embodiments, the second removable fan assembly 220*b* may alternatively be mounted at various other locations along the ambient airflow path 460 (e.g., externally to the side of cooling chassis 140 and over ambient air inlet 430 (as is shown in FIGS. 2 and 4), within the cooling chassis 140 and between the ambient air inlet 430 and the heat exchanger 210, within the cooling chassis 140 and between the heat exchanger 210 and the ambient air outlet 440, etc.). In other embodiments there may be additional removable fan assemblies 220 (not depicted) mounted at any of the various locations along the ambient airflow path 460 to affect the airflow rate along the ambient airflow path 460.

In some embodiments, the third removable fan assembly 220*c* is externally mounted to the side of housing chassis 130, over internal air outlet 310, allowing the fans 510*g-i* to propel air along the internal airflow path 330. In other embodiments, the third removable fan assembly 220*c* may alternatively be mounted at various other locations along the internal airflow path 330 (e.g., within the housing chassis 130 and between the internal air outlet 310 and the electronic device 260, within the housing chassis 130 and between the electronic device 260 and the internal air inlet 320, externally to the side of housing chassis 130 and over internal air inlet 320, etc.). In other embodiments, there may be additional removable fan assemblies 220 (not depicted) mounted at any of the various locations along the internal airflow path 330 to affect the airflow rate along the internal airflow path 330.

In various embodiments, the constituent fans 510*j-k* of the electronic device 260 are housed on or within the electronic device 260 itself, independently of any removable fan assembly 220, and can be driven by signals internal to the electronic device 260 or received from the fan controller 230, or both. In various embodiments, the fan controller 230 treats the electronic device 260 as a fan assembly for the constituent fans 510 thereof, and may variously take over control of the fans 510 from the electronic device 260, disable the fans 510, or react to the electronic device 260 controlling the fans 510. For example, when the fan controller 230 determines to set an flowrate in the closed-loop airflow path to X meters per second, fans 510 in the first removable fan assembly 200a may be set to a first speed. However, the fan controller 230 can reduce the speed of the first removable fan assembly 220a when the electronic device 260 or the fan controller 230 activates the constituent fans 510j-k of the electronic device 260.

Various fan control lines 1210a-c (generally or collectively, fan control lines 1210) are routed from the fan controller 230 to the respective removable fan assemblies 220a-c to control and power the constituent fans 510a-i thereof.

The fan signal line 250 enables various operational readings (e.g., temperature, humidity, fan speed, voltage) to be transferred among the electronic device 260, various sensors disposed in the cooling assembly 160 (not depicted), and the fan controller 230 and vice versa. In various embodiments, the electronic device 260 is a network connected device that can forward fan control set points received from the network to the fan controller 230 to generate fan control signals based on the various operational readings. The fan controller 230 processes the set points and operational readings into fan control signals that are transmitted via the various fan control lines 1210 to the respective removable fan assemblies 220 or the electronic device 260 (when including controllable fans 510j-k).

Because each removable fan assembly 220 can be independently controlled by the fan controller 230, the associated fans 510 of each removable fan assembly 220 can propel air at different intensities from the associated fans 510 of the other removable fan assemblies 220. In some embodiments, the fan controller 230 can drive all of the removable fan assemblies 220 at the same intensity.

In some embodiments, each fan control line 1210 drives the fans 510 of a removable fan assembly 220 in parallel so that the associated fans 510 in a removable fan assembly 220 receive identical control signals and propel air with the same intensity. In other embodiments, each fan 510 in a fan assembly 220 may be driven to propel air at varying individual intensities via a corresponding individual fan control line 1210, a microcontroller included in the removable fan assembly 220, or a powered switch included in the removable fan assembly 220.

In some embodiments, the electronic device 260, the fan controller 230, or any other computing device of the fan controller system 1200 may be connected via wired or wireless communications to the internet or a private network. The connected component device can report to remote users or a remote computer the operational readings from the cooling assembly 160. The remote user or remote computer can then process the readings and provide command signals back to the electronic device 260, the fan controller 230, or any other computing device of the fan controller system 1200 via the internet or private network. These command signals can then be converted by the electronic device 260, the fan controller 230, or any other computing device of the fan controller system 1200 into fan control signals to control the operations of some or all of the associated removable fan assemblies 220 without assistance from a local technician.

Figure 13:
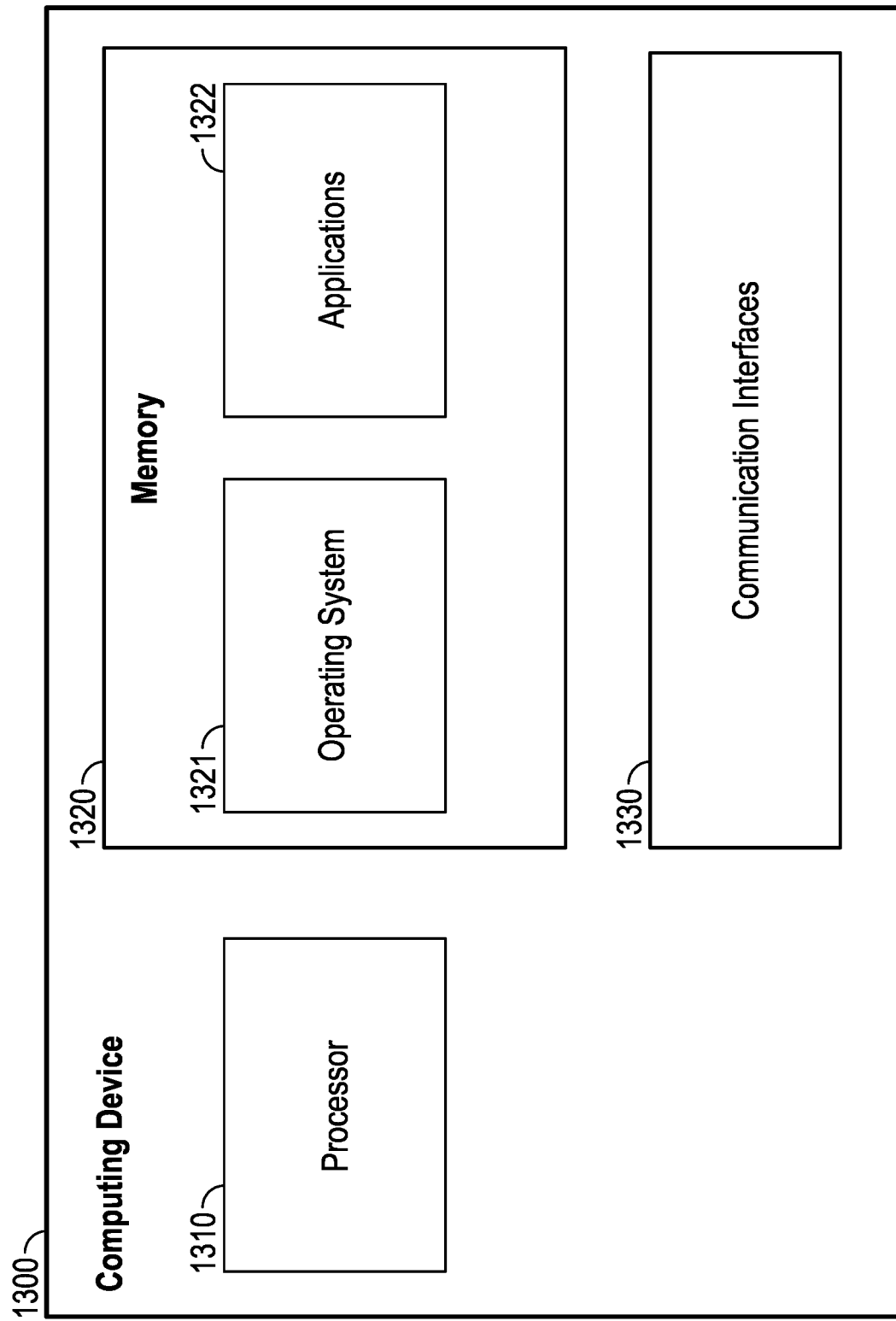
FIG. 13 is a block diagram of a computing device, according to embodiments of the present disclosure.

FIG. 13 illustrates hardware of a computing device 1300 such as can be included in an electronic device 260 or a fan controller 230 as described herein. The computing device 1300 includes a processor 1310, a memory 1320, and communication interfaces 1330. The processor 1310 may be any processing element capable of performing the functions described herein. The processor 1310 represents a single processor, multiple processors, a processor with multiple cores, and combinations thereof. The communication interfaces 1330 facilitate communications between the computing device 1300 and other devices. The communication interfaces 1330 are representative of wireless communications antennas (both omnidirectional and directional), various steering mechanisms for the antennas, and various wired communication ports including out-pins and in-pins to a microcontroller. The memory 1320 may be either volatile or non-volatile memory and may include RAM, flash, cache, disk drives, and other computer readable memory storage devices. Although shown as a single entity, the memory 1320 may be divided into different memory storage elements such as RAM and one or more hard disk drives.

As shown, the memory 1320 includes various instructions that are executable by the processor 1310 to provide an operating system 1321 to manage various functions of the computing device 1300 and one or more applications 1322 to provide various functionalities to users of the computing device 1300, which include one or more of the functions and functionalities described in the present disclosure.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A system, comprising:
 a heat exchanger including an ambient airflow path in a first direction, and a recirculating airflow path in a second direction, wherein the ambient airflow path is separated from the recirculating airflow path;
 housing for an electronic device, the housing including an internal airflow path linked to the recirculating airflow path;
 an ambient air fan assembly configured to propel ambient air through the heat exchanger in the ambient airflow path; and
 a recirculating air fan assembly configured to propel air through the heat exchanger in the recirculating airflow path.

2. The system of claim 1, wherein the recirculating air fan assembly is configured to propel air through the housing in the internal airflow path.

3. The system of claim 1, further comprising:
 an internal fan assembly located in the housing, configured to propel air through the electronic device in the internal airflow path.

4. The system of claim 1, further comprising:
 an exchanger controller in communication with the electronic device, configured to provide control of the ambient air fan assembly and the recirculating air fan assembly based on heat dissipation and temperature in the electronic device.

5. The system of claim 1, wherein the housing is located in a first plane and the heat exchanger is located in a second plane parallel to the first plane.

6. The system of claim 1, wherein the system further comprises:
 a first duct configured to link a plurality of recirculating air outlets to an internal air inlet in the housing; and
 a second duct configured to link a plurality of recirculating air inlets to the internal air outlet in the housing.

7. The system of claim 6, wherein the first duct is configured to link a recirculating air outlet to a plurality of internal air inlets, and the second duct is configured to link the recirculating air inlet to a plurality of internal air outlets.

8. The system of claim 1, wherein at least one of the recirculating air fan assembly, the ambient air fan assembly, fan controller unit, heat exchanger, or air filter are configured for in-place replacement, wherein the electronic device remains installed and powered when the recirculating air fan assembly or the ambient air fan assembly are removed from the system.

9. The system of claim 1, wherein the electronic device is selectively removable while the heat exchanger remains mounted in a modular cabinet.

10. A system, comprising:
 a first rack-mountable chassis, comprising:
 an ambient airflow path in a first direction;
 a recirculating airflow path in a second direction perpendicular to the first direction;

a heat exchanger disposed in the ambient airflow path and the recirculating airflow path, configured to isolate the ambient airflow path from the recirculating airflow path; and a second rack-mountable chassis, comprising:

an internal airflow path in a third direction, wherein the internal airflow path is linked to the recirculating airflow path, and wherein the third direction is in a different plane from the second direction.

11. The system of claim 10, wherein the recirculating airflow path, the internal airflow path, a first duct configured to link a recirculating air outlet in the first rack-mountable chassis to an internal air inlet in the second rack-mountable chassis, and a second duct configured to link a recirculating air inlet in the first rack-mountable chassis to an internal air outlet in the second rack-mountable chassis form a closed-loop, isolated from ambient air, wherein the closed-loop enables recirculation of air carried along the recirculating airflow path and the internal airflow path, and wherein the closed-loop enables heat transfer, via the heat exchanger, between air carried via the ambient airflow path and air carried via the closed-loop.

12. The system of claim 11, further comprising a recirculating air fan assembly configured to propel air through the closed-loop.

13. The system of claim 11, wherein the first duct is configured to link a plurality of recirculating air outlets to an internal air inlet in the second rack-mountable chassis, and the second duct is configured to link a plurality of recirculating air inlets to an internal air outlet in the second rack-mountable chassis.

14. The system of claim 11, wherein the first duct is configured to link the recirculating air outlet to a plurality of internal air inlets, and the second duct is configured to link the recirculating air inlet to a plurality of internal air outlets.

15. The system of claim 10, wherein the first rack-mountable chassis further comprises an ambient air fan assembly configured to propel air through the ambient airflow path.

16. The system of claim 10, further comprising a fan assembly and a fan controller configured to provide control of the fan assembly based on a temperature reading in the second rack-mountable chassis.

17. The system of claim 10, wherein the first rack-mountable chassis further comprises an air filter located at an ambient air inlet of the ambient airflow path.

18. A heatsink connected to an electronic device, comprising:

an ambient air inlet;

an ambient air outlet;

a recirculating air inlet connected to the electronic device;

a recirculating air outlet connected to the electronic device; and ducting, configured to isolate recirculating air carried via the recirculating air inlet, and the recirculating air outlet from air carried via the ambient air inlet and the ambient air outlet.

19. The heatsink of claim 18, wherein the ducting is configured to link a plurality of recirculating air outlets to an internal air inlet in a rack-mountable chassis, and to link a plurality of recirculating air inlets to an internal air outlet in the rack-mountable chassis.

20. The heatsink of claim 18, wherein the ducting is configured to link the recirculating air outlet to a plurality of internal air inlets, and to link the recirculating air inlet to a plurality of internal air outlets.

* * * * *